United States Patent
Park

(10) Patent No.: US 10,854,288 B2
(45) Date of Patent: Dec. 1, 2020

(54) SEMICONDUCTOR MEMORY APPARATUS FOR PREVENTING DISTURBANCE

(71) Applicant: SK hynix Inc., Icheon-si (KR)

(72) Inventor: Jin Su Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 91 days.

(21) Appl. No.: 16/206,901

(22) Filed: Nov. 30, 2018

(65) Prior Publication Data

US 2019/0304540 A1    Oct. 3, 2019

(30) Foreign Application Priority Data

Mar. 27, 2018  (KR) .................. 10-2018-0035215

(51) Int. Cl.
| G11C 11/34 | (2006.01) |
| G11C 13/00 | (2006.01) |
| G11C 5/14  | (2006.01) |

(52) U.S. Cl.
CPC .......... G11C 13/0033 (2013.01); G11C 5/147 (2013.01); G11C 13/003 (2013.01); G11C 13/0026 (2013.01); G11C 13/0028 (2013.01); G11C 13/0038 (2013.01)

(58) Field of Classification Search
CPC ....... G11C 16/24; G11C 16/3418; G11C 8/08; G11C 13/0026; G11C 13/0028; G11C 11/34
See application file for complete search history.

(56) References Cited

U.S. PATENT DOCUMENTS

| 6,747,899 B2 * | 6/2004 | Hsia ................. | G11C 8/08 |
| | | | 365/185.17 |
| 7,463,522 B2 | 12/2008 | Dong et al. | |
| 2009/0086542 A1 * | 4/2009 | Lee .................... | G11C 11/5628 |
| | | | 365/185.17 |
| 2009/0231923 A1 * | 9/2009 | Torsi ................. | G11C 16/3418 |
| | | | 365/185.19 |
| 2009/0273979 A1 * | 11/2009 | Aritome ............ | G11C 16/3459 |
| | | | 365/185.17 |
| 2013/0182505 A1 * | 7/2013 | Liu .................... | G11C 16/10 |
| | | | 365/185.17 |
| 2013/0250652 A1 * | 9/2013 | Toda ................. | G11C 13/0097 |
| | | | 365/148 |
| 2016/0267995 A1 * | 9/2016 | Chang ............... | G11C 16/0475 |
| 2020/0118630 A1 * | 4/2020 | Lin .................... | G11C 16/26 |

\* cited by examiner

*Primary Examiner* — Tuan T Nguyen
(74) *Attorney, Agent, or Firm* — William Park & Associates Ltd.

(57) ABSTRACT

A semiconductor memory apparatus includes an access line control circuit. The access line control circuit applies a selected bias voltage to a selected access line coupled with a target memory cell and applies a first unselected bias voltage to an unselected access line adjacent to the selected access line. A second unselected bias voltage is applied to an unselected access line not adjacent to the selected access line.

12 Claims, 10 Drawing Sheets

SEMICONDUCTOR MEMORY APPARATUS FOR PREVENTING DISTURBANCE

CROSS-REFERENCES TO RELATED APPLICATION

The present application claims priority under 35 U.S.C. § 119(a) to Korean application number 10-2018-0035215, filed on Mar. 27, 2018, in the Korean Intellectual Property Office, which is incorporated herein by reference in its entirety.

BACKGROUND

1. Technical Field

Various embodiments generally relate to integrated circuit technology and, more particularly, to a semiconductor apparatus and a semiconductor memory apparatus.

2. Related Art

Electronic apparatuses may include a large number of electronic components. Among the electronic apparatuses, a computer system may include many electronic components constructed by semiconductors. The computer system may include a memory apparatus. DRAM is being widely used as a general memory apparatus because it has advantages in that it is able to store and output data at a high and constant speed and is capable of random access. However, because DRAM includes memory cells each constructed using a capacitor, DRAM has a volatile characteristic in that it loses stored data when power is cut off. In order to overcome this disadvantage of DRAM, flash memory has been developed. Because flash memory includes memory cells each constructed using a floating gate, flash memory has a nonvolatile characteristic in that it is able to retain stored data even when power is cut off. However, flash memory has a disadvantage in that data storage and output speed is slower than for DRAM and is difficult to perform random access.

Recently, next-generation memory apparatuses, such as phase change RAM, magnetic RAM, resistive RAM, and ferroelectric RAM have been developed. The next-generation memory apparatuses have advantages in that they have a nonvolatile characteristic and are able to operate at high speed. In particular, PRAM includes memory cells which are formed using a chalcogenide compound and may store data by changing a resistance value of each memory cell.

SUMMARY

In an embodiment, a semiconductor memory apparatus may include an access line control circuit. The access line control circuit may be configured to apply a selected bias voltage to a selected access line coupled with a target memory cell and configured to apply a first unselected bias voltage to an unselected access line adjacent to the selected access line. A second unselected bias voltage may be applied to an unselected access line not adjacent to the selected access line.

In an embodiment, a semiconductor memory apparatus may include a bit line control circuit and a word line control circuit. The bit line control circuit may be configured to apply a selected bit line bias voltage to a selected bit line coupled with a target memory cell and apply a first unselected bit line bias voltage to an unselected bit line adjacent to the selected bit line. The word line control circuit may be configured to apply a selected word line bias voltage to a selected word line coupled with the target memory cell and apply a first unselected word line bias voltage to an unselected word line adjacent to the selected word line. A second unselected bit line bias voltage may be applied to an unselected bit line not adjacent to the selected bit line. Further, a second unselected word line bias voltage may be applied to an unselected word line not adjacent to the selected word line.

In an embodiment, a semiconductor memory apparatus may include a bit line control circuit and a word line control circuit. The bit line control circuit may be configured to apply a selected bit line bias voltage to a selected bit line coupled with a target memory cell and apply a bit line voltage, having a voltage level between a first unselected bit line bias voltage and a second unselected bit line bias voltage, which is higher in proportion to a distance from the selected bit line to an unselected bit line to which the bit line voltage is applied. The word line control circuit may be configured to apply a selected word line bias voltage to a selected word line coupled with the target memory cell and apply a word line voltage, having a voltage level between a first unselected word line bias voltage and a second unselected word line bias voltage, which is lower in proportion to a distance from the selected word line to an unselected word line to which the word line voltage is applied.

In an embodiment, a semiconductor memory apparatus may include a plurality of global bit lines, a plurality of bit line groups, and a bit line control circuit. The plurality of bit line groups may each include a plurality of bit lines coupled with the plurality of global bit lines, respectively. The bit line control circuit may be configured to select one of the plurality of bit line groups based on a bit line select signal and apply different bit line bias voltages to the plurality of global bit lines.

In a further embodiment, the different bit line bias voltages may include at least two of a selected bit line bias voltage, a first unselected bit line bias voltage, a second unselected bit line bias voltage, and a third unselected bit line bias voltage. The first unselected bit line bias voltage may be lower than the third unselected bit line bias voltage, the third unselected bit line bias voltage may be lower than the second unselected bit line bias voltage, and the second unselected bit line bias voltage may be lower than the selected bit line bias voltage.

In an embodiment, a semiconductor memory apparatus may include a plurality of global word lines, a plurality of word line groups, and a word line control circuit. The plurality of word line groups may each include a plurality of word lines coupled with the plurality of global word lines, respectively. The word line control circuit may be configured to select one of the plurality of word line groups based on a word line select signal and apply different word line bias voltages to the plurality of global word lines.

In a further embodiment, the different word line bias voltages may include at least two of a selected word line bias voltage, a first unselected word line bias voltage, a second unselected word line bias voltage, and a third unselected word line bias voltage. The first unselected word line bias voltage may be higher than the third unselected word line bias voltage, the third unselected word line bias voltage may be higher than the second unselected word line bias voltage, and the second unselected word line bias voltage may be higher than the selected word line bias voltage.

DETAILED DESCRIPTION

Hereinafter, a semiconductor memory apparatus for preventing or mitigating disturbances is described below with reference to the accompanying drawings through various example embodiments.

Figure 1:
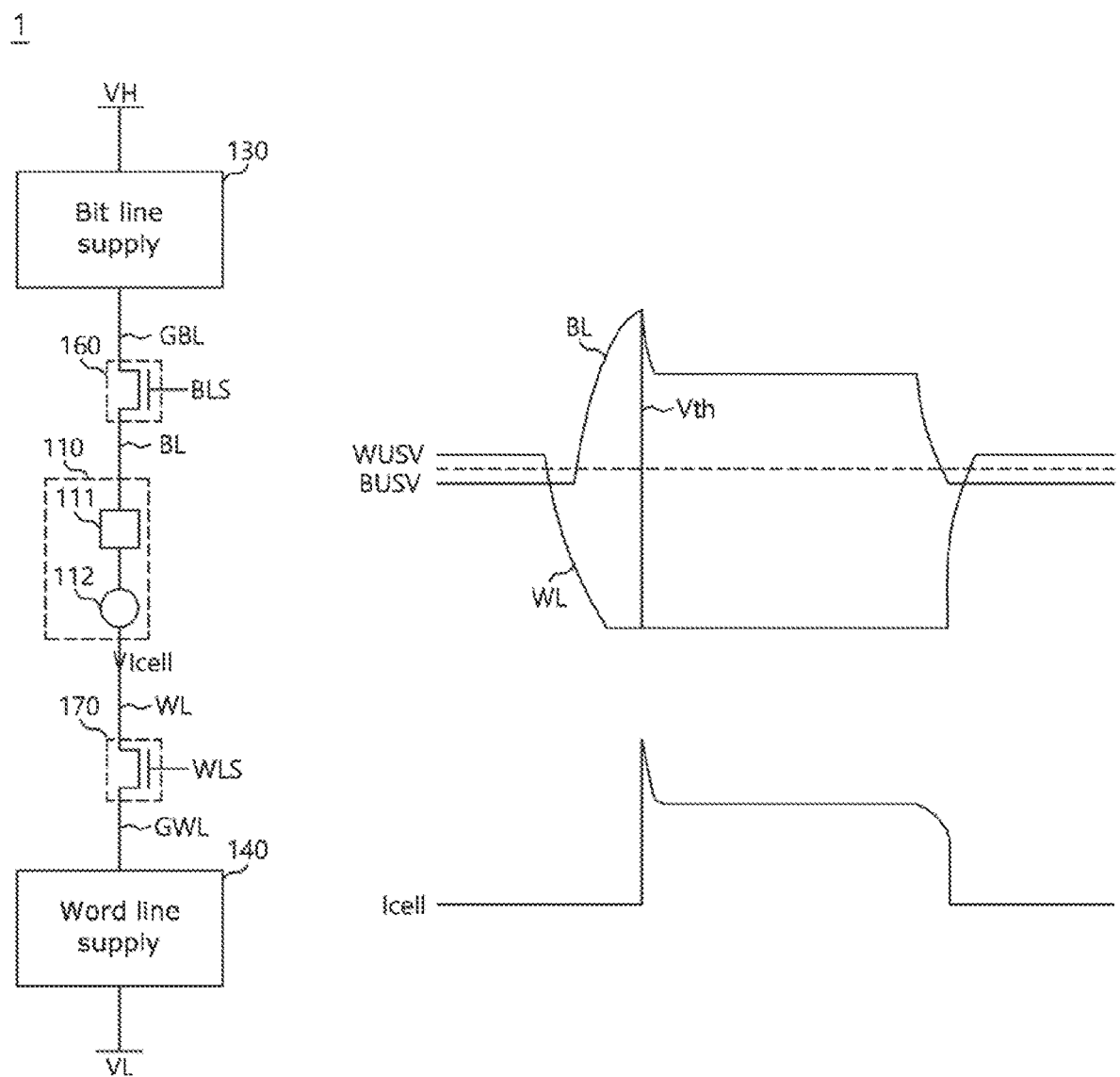
FIG. 1 shows a diagram illustrating a configuration and operation of a semiconductor memory apparatus in accordance with an embodiment.

FIG. 1 shows a diagram illustrating a configuration and operation of a semiconductor memory apparatus 1 in accordance with an embodiment. In FIG. 1, the semiconductor memory apparatus 1 may include a memory cell 110. The memory cell 110 may include a resistive element 111 and a switching element 112. The resistive element 111 of the memory cell 110 may have different resistance states depending on a current and/or a voltage applied during a write operation. For example, the memory cell 110 may have a high resistance state and/or a reset state and may have a low resistance state and/or a set state. The memory cell 110 may store different data depending on a resistance state. In an embodiment, the memory cell 110 may be changed to a plurality of three or more states, and may store multi-bit data of two or more bits. The switching element 112 may be turned on when a current equal to or larger than a threshold value is applied to the memory cell 110 or the voltage difference of both ends of the memory cell 110 is applied to be equal to or higher than a threshold value. When turned on, the switching element 112 allows an unlimited amount of current to flow through the memory cell 110. The switching element 112 may be an Ovonic threshold switch (OTS).

The memory cell 110 may be coupled between a global bit line GBL and a global word line GWL. The memory cell 110 may have one end which is coupled with the global bit line GBL and the other end which is coupled with the global word line GWL. The semiconductor memory apparatus 1 may have a hierarchical bit line and word line structure. The one end of the memory cell 110 may be coupled with a bit line BL, and the bit line BL may be coupled with the global bit line GBL through a column switch 160. The column switch 160 may couple the bit line BL and the global bit line GBL based on a bit line select signal BLS. The other end of the memory cell 110 may be coupled with a word line WL, and the word line WL may be coupled with the global word line GWL through a row switch 170. The row switch 170 may couple the word line WL and the global word line GWL based on a word line select signal WLS.

The semiconductor memory apparatus 1 may include a bit line supply 130 and a word line supply 140. The bit line supply 130 may supply a bit line bias voltage to the global bit line GBL when the semiconductor memory apparatus 1 performs a write operation or a read operation. The bit line supply 130 may receive a high voltage VH, and may supply the bit line bias voltage to the global bit line GBL during the write operation or the read operation, thereby raising the voltage level of the global bit line GBL. The high voltage VH may be a power supply voltage which has a sufficiently high voltage level. The word line supply 140 may supply a word line bias voltage to the global word line GWL when the semiconductor memory apparatus 1 performs a write operation or a read operation. The word line supply 140 may receive a low voltage VL, and may supply the word line bias voltage to the global word line GWL, thereby lowering the voltage level of the global word line GWL. The low voltage VL may have a level lower than the high voltage VH, and may be a ground voltage or a power supply voltage having a level equal to or lower than the ground voltage. The difference between the voltage level of the global bit line GBL raised by the bit line supply 130 and the voltage level of the global word line GWL lowered by the word line supply 140 may correspond to a write voltage for programming data to the memory cell 110 or a read voltage for reading data stored in the memory cell 110.

In FIG. 1, there is shown a timing diagram for a set write operation of the semiconductor memory apparatus 1. Before the semiconductor memory apparatus 1 performs the set write operation, the bit line BL may be held at the level of an unselected bit line bias voltage BUSV, and the word line WL may be held at the level of an unselected word line bias voltage WUSV. When the semiconductor memory apparatus 1 performs the write operation for the memory cell 110, the bit line select signal BLS and the word line select signal WLS may be enabled to turn on the column switch 160 and the row switch 170, respectively, which are coupled with the memory cell 110. In order to program the memory cell 110 to a set state, the bit line supply 130 may raise the voltage level of the global bit line GBL and the bit line BL, and the word line supply 140 may lower the voltage level of the global word line GWL and the word line WL. If the difference between the voltage level of the bit line BL and the voltage level of the word line WL reaches a threshold value Vth, the snapback of the memory cell 110 occurs, and the amount of a current Icell flowing through the memory cell 110 may be abruptly increased. If the snapback occurs, the voltage level of the bit line BL may be lowered by a predetermined level, and, as a lowered voltage is applied for a predetermined time, the memory cell 110 may be programmed to the set state. If the predetermined time elapses and the set write operation is ended, the voltage level of the bit line BL and the global bit line GBL may be changed to the level of the unselected bit line bias voltage BUSV, and the voltage level of the word line WL and the global word line GWL may be changed again to the level of the unselected word line bias voltage WUSV. In an embodiment, the levels of the unselected bit line bias voltage BUSV and the unselected word line bias voltage WUSV may have a level corresponding to the middle of the threshold value Vth. The unselected word line bias voltage WUSV may have the same level as the unselected bit line bias voltage BUSV. Alternatively, the unselected word line bias voltage WUSV may have a level higher than the unselected bit line bias voltage BUSV.

Figure 2:
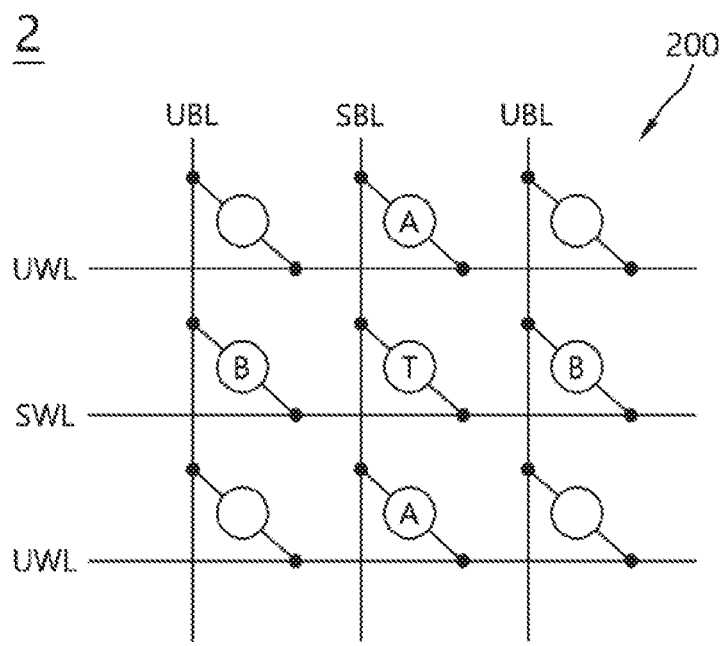
FIG. 2 shows a diagram illustrating a semiconductor memory apparatus and a memory cell array in accordance with an embodiment.
Figure 3:
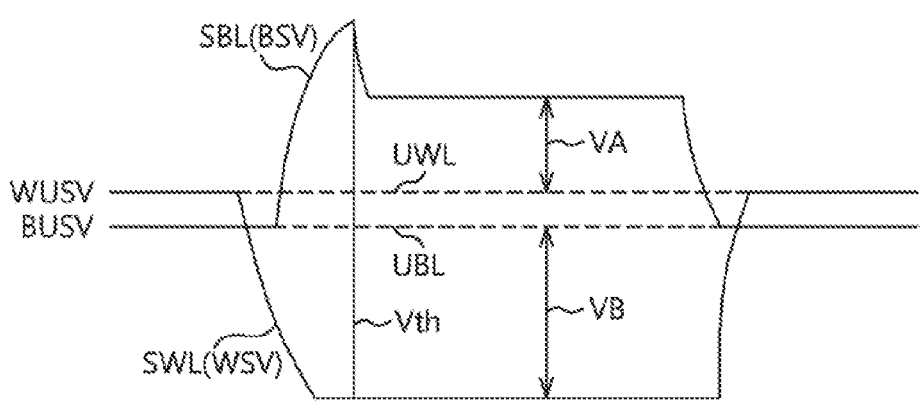
FIG. 3 shows a diagram illustrating an operation of a semiconductor memory apparatus in accordance with an embodiment.

FIG. 2 shows a diagram illustrating a semiconductor memory apparatus 2 and a memory cell array 200 in accordance with an embodiment. FIG. 3 shows a diagram illustrating the operation of the semiconductor memory apparatus 2 in accordance with the embodiment. Specifically, FIG. 3 shows the voltage levels of a selected bit line SBL, a selected word line SWL, an unselected bit line UBL, and an unselected word line UWL. In FIG. 2, the memory cell array 200 may include a plurality of access lines. The plurality of access lines may include a plurality of first access lines which are disposed in a column direction and a plurality of second access lines which are disposed in a row direction. As a specific access line is selected among the plurality of first access lines and a specific access line is selected among the plurality of second access lines, a write operation and/or a read operation may be performed for a memory cell which is coupled with the selected access lines. For example, the first access lines may be bit lines, and the second access lines may be word lines. A plurality of memory cells may be coupled where the plurality of bit lines and the plurality of word lines intersect with each other. In order to perform a write operation or a read operation for a target memory cell T, a bit line SBL which is coupled with one end of the target memory cell T and a word line SWL which is coupled with the other end of the target memory cell T may be selected. As shown in FIG. 3, the voltage level of the selected bit line SBL may be raised, and the voltage level of the selected word line SWL may be lowered. If the difference in the voltage levels of the selected bit line SBL and the selected word line SWL reaches a threshold value fifth, the target memory cell T may be turned on and a snapback may occur. Therefore, as a current flows from the selected bit line SBL to the selected word line SWL through the target memory cell T, the write operation or the read operation for the target memory cell T may be performed.

A selected bit line bias voltage BSV may be applied to the selected bit line SBL, and an unselected bit line bias voltage BUSV may be applied to an unselected bit line UBL. A selected word line bias voltage WSV may be applied to the selected word line SWL, and an unselected word line bias voltage WUSV may be applied to an unselected word line UWL. One end of a memory cell A may be coupled with the unselected word line UWL, and the other end of the memory cell A may be coupled with the selected bit line SBL. Therefore, the voltage level difference between the selected bit line SBL and the unselected word line UWL to which the memory cell A is coupled may be VA. Also, one end of a memory cell B may be coupled with an unselected bit line UBL, but the other end of the memory cell B may be coupled with the selected word line SWL, Therefore, the voltage level difference between the unselected bit line UBL and the selected word line SWL to which the memory cell B is coupled may be VB. In general, because VA and VB are smaller than the threshold value of a memory cell, memory cells except the target memory cell T are not turned on. However, the threshold voltage of a memory cell may be changed depending on a variation in process, voltage, and/or temperature, and there may be a case where the memory cell is turned on in response to the voltage of VA or VB. Thus, as a memory cell which is adjacent to the target memory cell T is turned on, a disturbance whereby the memory cell loses stored data may occur.

Figure 4:
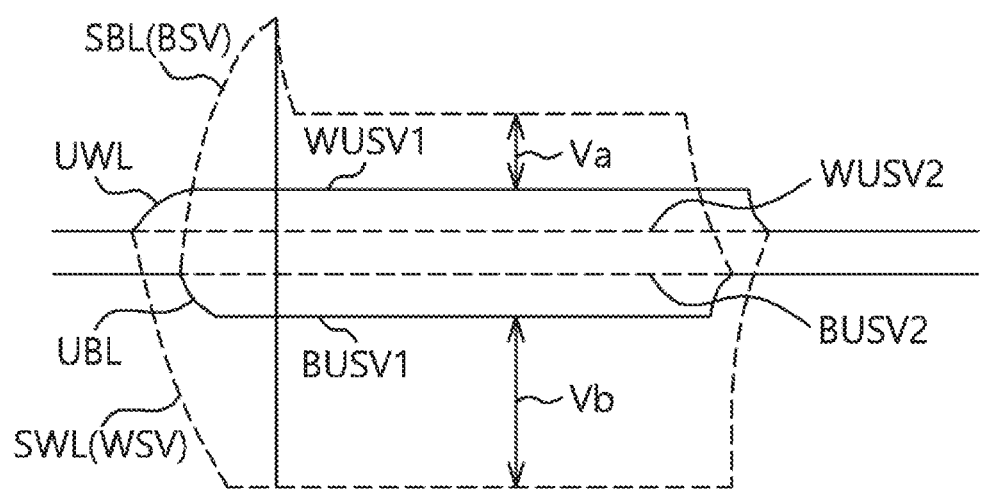
FIG. 4 shows a diagram illustrating an operation of a semiconductor memory apparatus in accordance with an embodiment.

FIG. 4 shows a diagram illustrating the operation of the semiconductor memory apparatus 2 in accordance with and embodiment. The semiconductor memory apparatus 2 may apply the selected bit line bias voltage BSV to the selected bit line SBL which is coupled with the target memory cell T, and may apply the selected word line bias voltage WSV to the selected word line SWL which is coupled with the target memory cell T. The level difference between the selected bit line bias voltage BSV and the selected word line bias voltage WSV may correspond to a write voltage or a read voltage. The semiconductor memory apparatus 2 may apply a first unselected bit line bias voltage BUSV1 to the unselected bit line UBL which is adjacent to the selected bit line SBL. The semiconductor memory apparatus 2 may apply a second unselected bit line bias voltage BUSV2 to an unselected bit line (not shown) which is not adjacent to the selected bit line SBL. The semiconductor memory apparatus 2 may apply a first unselected word line bias voltage WUSV1 to the unselected word line UWL which is adjacent to the selected word line SWL. The semiconductor memory apparatus 2 may apply a second unselected word line bias voltage WUSV2 to an unselected word line (not shown) which is not adjacent to the selected word line SWL. The first unselected bit line bias voltage BUSV1 may have a level lower than the second unselected bit line bias voltage BUSV2, and the second unselected bit line bias voltage BUSV2 may have a level lower than the selected bit line bias voltage BSV. The first unselected word line bias voltage WUSV1 may have a level higher than the second unselected word line bias voltage WUSV2, and the second unselected word line bias voltage WUSV2 may have a level higher than the selected word line bias voltage WSV. The second unselected bit line bias voltage BUSV2 may have a voltage level corresponding to the middle of the selected bit line bias voltage BSV and the selected word line bias voltage WSV. The second unselected word line bias voltage WUSV2 may have a voltage level corresponding to the middle of the selected bit line bias voltage BSV and the selected word line bias voltage WSV. For example, each of the second unselected bit line bias voltage BUSV2 and the second unselected word line bias voltage WUSV2 may have a voltage level corresponding to a ground voltage. In an embodiment, the second unselected bit line bias voltage BUSV2 may have a level lower than the second unselected word line bias voltage WUSV2. The semiconductor memory apparatus 2 may include a bit line control circuit which may apply the selected bit line bias voltage BSV, the first unselected bit line bias voltage BUSV1, and the second unselected bit line bias voltage BUSV2 to the selected bit line SBL and unselected bit lines. The semiconductor memory apparatus 2 may include a word line control circuit which may apply the selected word line bias voltage WSV, the first unselected word line bias voltage WUSV1, and the second unselected word line bias voltage WUSV2 to the selected word line SWL and unselected word lines.

As shown in FIG. 4, when a bit line and a word line are not selected, the bit line may hold the level of the second unselected bit line bias voltage BUSV2, and the word line may hold the level of the second unselected word line bias voltage WUSV2. In order to perform the write operation and/or the read operation for the target memory cell T, the voltage level of the selected bit line SBL may be raised, and the voltage level of the selected word line SWL may be lowered. The selected bit line SBL may be raised to the level of the selected bit line bias voltage BSV, and the selected word line SWL may be lowered to the level of the selected word line bias voltage WSV. An unselected bit line which is not adjacent to the selected bit line SBL may hold the level of the second unselected bit line bias voltage BUSV2, and an unselected word line which is not adjacent to the selected word line SWL may hold the level of the second unselected word line bias voltage WUSV2. The unselected bit line UBL which is adjacent to the selected bit line SBL may be lowered to the level of the first unselected bit line bias voltage BUSV1, and the unselected word line UWL which is adjacent to the selected word line SWL may be raised to the level of the first unselected word line bias voltage WUSV1. Therefore, the voltage level difference of the bit line and the word line to which the memory cell A shown in FIG. 2 is coupled may be Va, and the voltage level difference of the bit line and the word line to which the memory cell B is coupled may be Vb. Va may be reduced by the difference between the first unselected word line bias voltage WUSV1 and the second unselected word line bias voltage WUSV2 when compared to VA, and Vb may be reduced by the difference between the first unselected bit line bias voltage BUSV1 and the second unselected bit line bias voltage BUSV2 when compared to VB. Therefore, the voltage level difference of both ends of each of the memory cells A and B which are adjacent to the target memory cell T may be reduced, and a disturbance may be decreased.

Figure 5:
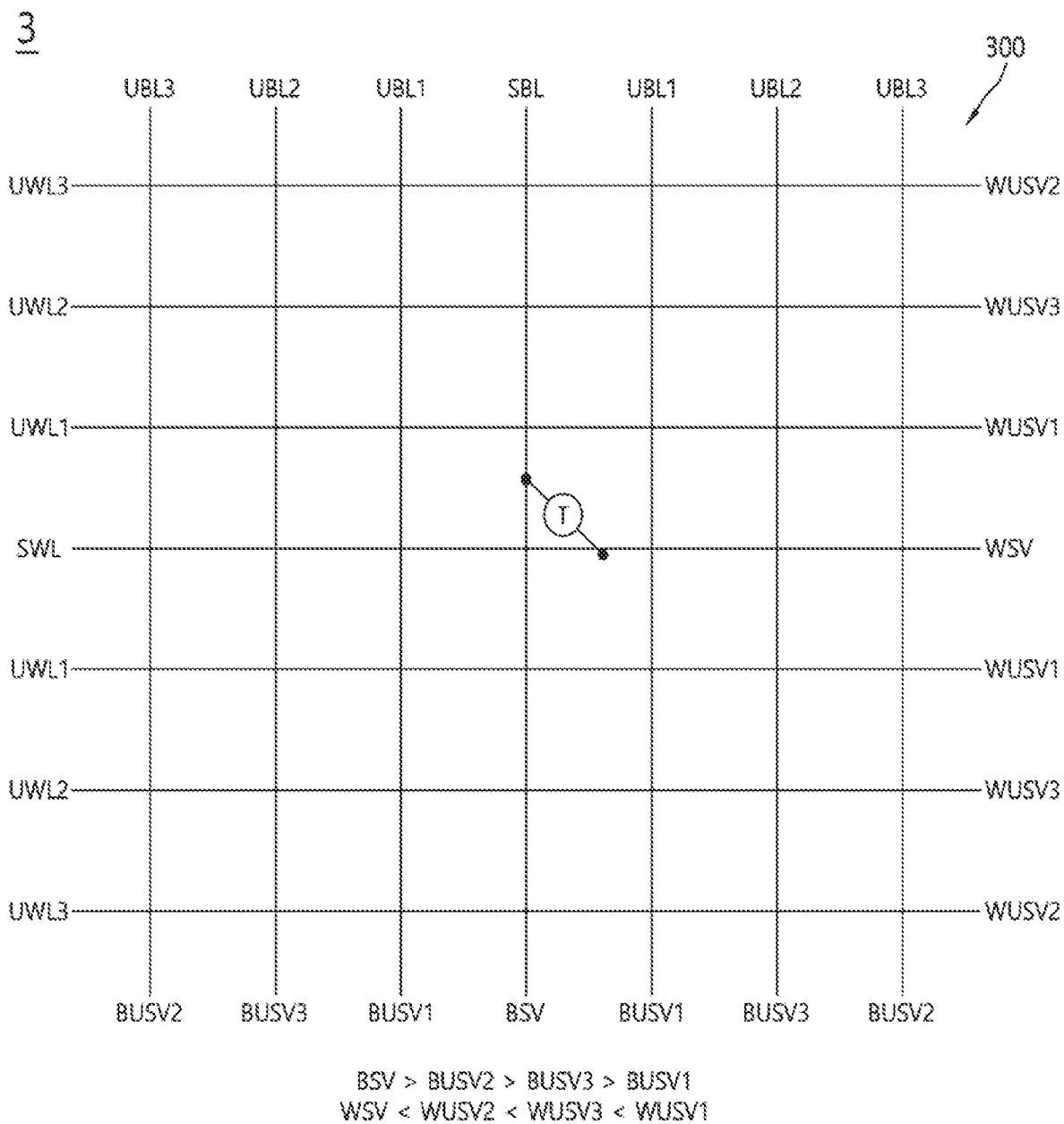
FIG. 5 shows a diagram illustrating a semiconductor memory apparatus and a memory cell array in accordance with an embodiment.

FIG. 5 shows a diagram illustrating a semiconductor memory apparatus 3 and a memory cell array 300 in accordance with an embodiment. In FIG. 5, the memory cell array 300 may include a plurality of bit lines and a plurality of word lines, A plurality of memory cells may be respectively coupled where the plurality of bit lines and the plurality of word lines intersect with each other. The semiconductor memory apparatus 3 may perform a write operation or a read operation for a target memory cell T by selecting a specific bit line and a specific word line. In order to allow the write operation or the read operation to be performed, a selected bit line bias voltage BSV may be applied to a selected bit line SBL, and a selected word line bias voltage WSV may be applied to a selected word line SWL. In the present embodiment, in order to prevent or mitigate the disturbance of a memory cell which is adjacent to the target memory cell T, a first unselected bit line bias voltage BUSV1 may be applied to a first unselected bit line UBL1 which is adjacent to the selected bit line SBL. A third unselected bit line bias voltage BUSV3 may be applied to a second unselected bit line UBL2 which is not adjacent to the selected bit line SBL, and a second unselected bit line bias voltage BUSV2 may be applied to a third unselected bit line UBL3. The third unselected bit line bias voltage BUSV3 may have a voltage level between the first and second unselected bit line bias voltage BUSV1 and BUSV2. The second unselected bit line UBL2 may be relatively more adjacent to the selected bit line SBL than the third unselected bit line UBL3. Therefore, by applying the third unselected bit line bias voltage BUSV3 which has a level lower than the second unselected bit line bias voltage BUSV2, to the second unselected bit line UBL2, a probability of the occurrence of a disturbance by the memory cell coupled to the second unselected bit line UBL2 may be further reduced. In an embodiment, the semiconductor memory apparatus 3 may apply a voltage the level of which increases between the first unselected bit line bias voltage BUSV1 and the second unselected bit line bias voltage BUSV2 in proportion to a distance from the selected bit line SBL to an unselected bit line, to the unselected bit line.

In the present embodiment, in order to prevent or mitigate the disturbance of a memory cell which is adjacent to the target memory cell T, a first unselected word line bias voltage WUSV1 may be applied to a first unselected word line UWL1 which is adjacent to the selected word line SWL. A third unselected word line bias voltage WUSV3 may be applied to a second unselected word line UWL2 which is not adjacent to the selected word line SWL, and a second unselected word line bias voltage WUSV2 may be applied to a third unselected word line UWL3. The third unselected word line bias voltage WUSV3 may have a voltage level between the first and second unselected word line bias voltage WUSV1 and WUSV2. The second unselected word line UWL2 may be relatively more adjacent to the selected word line SWL than the third unselected word line UWL3. Therefore, by applying the third unselected word line bias voltage WUSV3 which has a level higher than the second unselected word line bias voltage WUSV2, to the second unselected word line UWL2, a probability of the occurrence of a disturbance by the memory cell coupled to the second unselected word line UWL2 may be further reduced. In an embodiment, the semiconductor memory apparatus 3 may apply a voltage the level of which decreases between the first unselected word line bias voltage WUSV1 and the second unselected word line bias voltage WUSV2 in proportion to a distance from the selected word line SWL to an unselected word line, to the unselected word line. The semiconductor memory apparatus 3 may include a bit line control circuit to apply the selected bit line bias voltage BSV, the first unselected bit line bias voltage BUSV1, the second unselected bit line bias voltage BUSV2, and the third unselected bit line bias voltage BUSV3 to a selected bit line and unselected bit lines. The semiconductor memory apparatus 3 may include a word line control circuit to apply the selected word line bias voltage WSV, the first unselected word line bias voltage WUSV1, the second unselected word line bias voltage WUSV2, and the third unselected word line bias voltage WUSV3 to a selected word line and unselected word lines.

Figure 6:
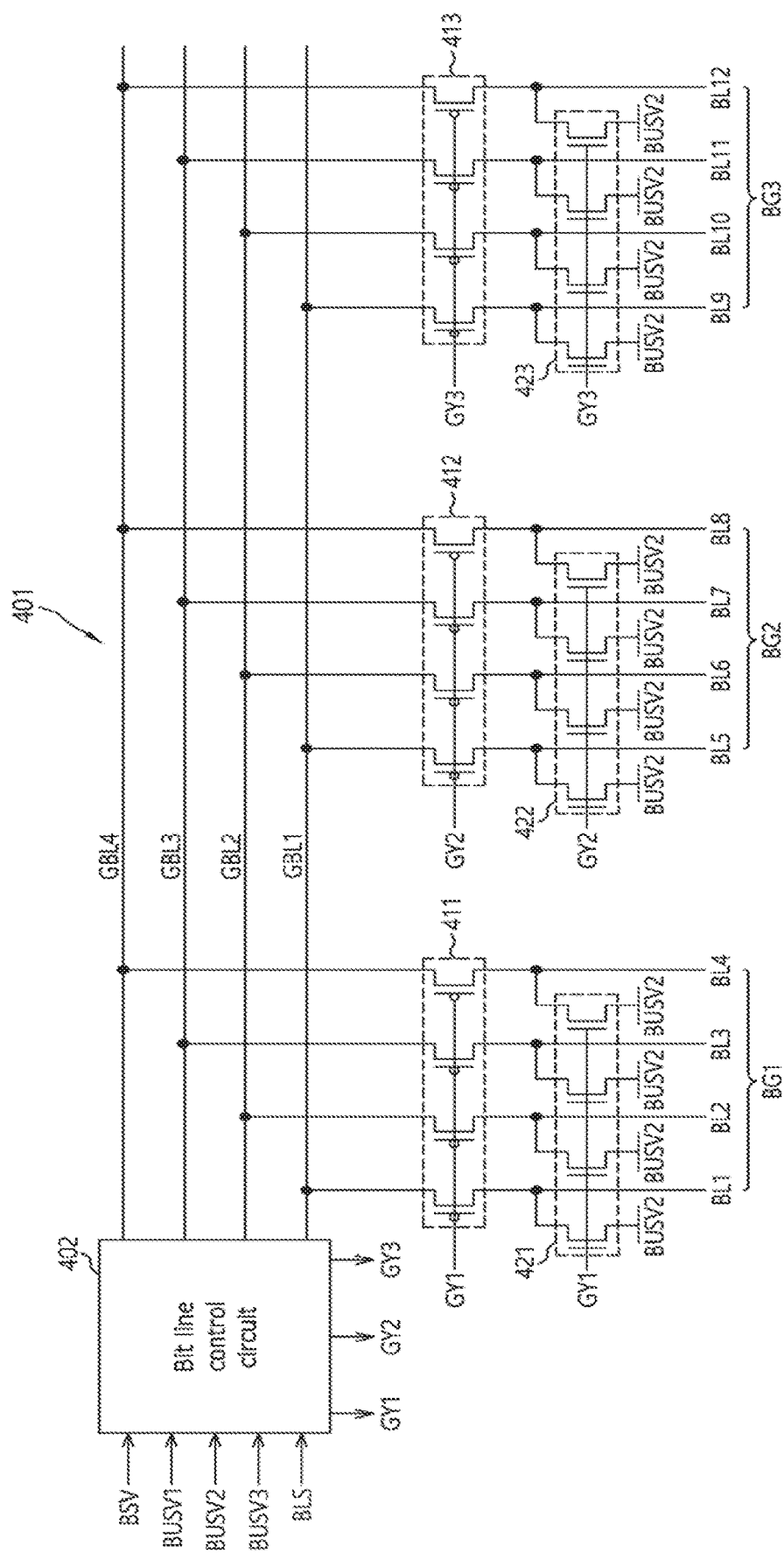
FIG. 6 shows a diagram illustrating a configuration of a semiconductor memory apparatus in accordance with an embodiment.

FIG. 6 shows a diagram illustrating a configuration of a semiconductor memory apparatus 4 in accordance with an embodiment. In FIG. 6, the semiconductor memory apparatus 4 may include a memory cell array 401 and a bit line control circuit 402. The memory cell array 401 may include a plurality of global bit lines and a plurality of bit lines. The plurality of bit lines may be a plurality of access lines. The bit line control unit may be an access line control circuit. In FIG. 6, the memory cell array 401 may include a first global bit line GBL1, a second global bit line GBL2, a third global bit line GBL3, and a fourth global bit line GBL4. The memory cell array 401 may include a plurality of bit line groups. The plurality of bit line groups may include a first bit line group BG1, a second bit line group BG2, and a third bit line group BG3, and each of the first to third bit line groups BG1, BG2, and BG3 may include bit lines the number of which corresponds to the number of global bit lines. Each of the first to third bit line groups BG1, BG2, and BG3 may include four bit lines. First to fourth bit lines BL1, BL2, BL3, and BL4 of the first bit line group BG1 may be coupled with the first to fourth global bit lines GBL1, GBL2, GBL3, and GBL4, respectively. First to fourth bit lines BL5, BL6, BL7, and BL8 of the second bit line group BG2 may be coupled with the first to fourth global bit lines GBL1, GBL2, GBL3, and GBL4, respectively, and the first bit line BL5 of the second bit line group BG2 may be adjacent to the fourth bit line BL4 of the first bit line group BG1. First to fourth bit lines BL9, BL10, BL11, and BL12 of the third bit line group BG3 may be coupled with the first to fourth global bit lines GBL1, GBL2, GBL3, and GBL4, respectively, and the first bit line BL9 of the third bit line group BG3 may be adjacent to the fourth bit line BL8 of the second bit line group BG2. While FIG. 6 shows three bit line groups, other embodiments are not so limited and may have four or more bit line groups. Also, while it is illustrated that the number of global bit lines and the number of bit lines which are included in each bit line group are 4, the number of global bit lines and the number of bit lines which are included in each bit line group may be greater or less than 4 in other embodiments.

The memory cell array 401 may include a first group switch 411, a second group switch 412, and a third group switch 413. The first group switch 411 may couple the first to fourth bit lines BL1, BL2, BL3, and BL4 of the first bit line group BG1 with the first to fourth global bit lines GBL1, GBL2, GBL3, and GBL4, respectively, based on a first group select signal GY1. For example, the first group switch 411 may couple the first to fourth bit lines BL1, BL2, BL3, and BL4 of the first bit line group BG1 with the first to fourth global bit lines GBL1, GBL2, GBL3, and GBL4, respectively, when the first group select signal GY1 is enabled, and might not couple the first to fourth bit lines BL1, BL2, BL3, and BL4 of the first bit line group BG1 with the first to fourth global bit lines GBL1, GBL2, GBL3, and GBL4 when the first group select signal GY1 is disabled.

The second group switch 412 may couple the first to fourth bit lines BL5, BL6, BL7, and BL8 of the second bit line group BG2 with the first to fourth global bit lines GBL1, GBL2, GBL3, and GBL4, respectively, based on a second group select signal GY2. For example, the second group switch 412 may couple the first to fourth bit lines BL5, BL6, BL7, and BL8 of the second bit line group BG2 with the first to fourth global bit lines GBL1, GBL2, GBL3, and GBL4, respectively, when the second group select signal GY2 is enabled, and might not couple the first to fourth bit lines BL5, BL6, BL7, and BL8 of the second bit line group BG2 with the first to fourth global bit lines GBL1, GBL2, GBL3, and GBL4 when the second group select signal GY2 is disabled.

The third group switch 413 may couple the first to fourth bit lines BL9, BL10, BL11, and BL12 of the third bit line group BG3 with the first to fourth global bit lines GBL1, GBL2, GBL3, and GBL4, respectively, based on a third group select signal GY3. For example, the third group switch 413 may couple the first to fourth bit lines BL9, BL10, BL11, and BL12 of the third bit line group BG3 with the first to fourth global bit lines GBL1, GBL2, GBL3, and GBL4, respectively, when the third group select signal GY3 is enabled, and might not couple the first to fourth bit lines BL9, BL10, BL11, and BL12 of the third bit line group BG3 with the first to fourth global bit lines GBL1, GBL2, GBL3, and GBL4 when the third group select signal GY3 is disabled.

The bit line control circuit 402 may receive a bit line select signal BLS. The bit line control circuit 402 may generate the first to third group select signals GY1, GY2, and GY3 based on the bit line select signal BLS. The bit line control circuit 402 may selectively enable the first to third group select signals GY1, GY2, and GY3 to select a bit line group in which a selected bit line is included. For example, when one of the first to fourth bit lines BL1, BL2, BL3, and BL4 of the first bit line group BG1 is selected based on the bit line select signal BLS, the bit line control circuit 402 may enable the first group select signal GY1 and disable the second and third group select signals GY2 and GY3. When one of the first to fourth bit lines BL5, BL6, BL7, and BL8 of the second bit line group BG2 is selected based on the bit line select signal BLS, the bit line control circuit 402 may enable the second group select signal GY2 and disable the first and third group select signals GY1 and GY3. Similarly, when one of the first to fourth bit lines BL9, BL10, BL11, and BL12 of the third bit line group BG3 is selected based on the bit line select signal BLS, the bit line control circuit 402 may enable the third group select signal GY3 and disable the first and second group select signals GY1 and GY2.

The bit line control circuit 402 may drive the first to fourth global bit lines GBL1, GBL2, GBL3, and GBL4 with different bit line bias voltages based on the bit line select signal BLS. The different bit line bias voltages may include all or some of a selected bit line bias voltage BSV, a first unselected bit line bias voltage BUSV1, a second unselected bit line bias voltage BUSV2, and a third unselected bit line bias voltage BUSV3. In an embodiment, the different bit line bias voltages may include the selected bit line bias voltage BSV and the first unselected bit line bias voltage BUSV1. The bit line control circuit 402 may apply the selected bit line bias voltage BSV to a global bit line to which a bit line selected based on the bit line select signal BLS is coupled. The bit line control circuit 402 may apply the first unselected bit line bias voltage BUSV1 to global bit lines which are not coupled with the bit line selected based on the bit line select signal BLS. For example, when the second bit line BL6 of the second bit line group BG2 is selected based on the bit line select signal BLS, the bit line control circuit 402 may apply the selected bit line bias voltage BSV to the second global bit line GBL2 which is coupled with the second bit line BL6, and may apply the first unselected bit line bias voltage BUSV1 to the first global bit line GBL1, the third global bit line GBL3, and the fourth global bit line GBL4.

The memory cell array 401 may include unselected voltage supply circuits 421, 422, and 423. The unselected voltage supply circuits 421, 422, and 423 may be coupled with the first to third bit line groups BG1, BG2, and BG3, respectively. The unselected voltage supply circuits 421, 422, and 423 may apply the second unselected bit line bias voltage BUSV2 to the first to fourth bit lines BL1, BL2, BL3, BL4, BL5, BL6, BL7, BL8, BL9, BL10, BL11, and BL12 of the first to third bit line groups BG1, BG2, and BG3 based on the first group select signal GY1, the second group select signal GY2, and the third group select signal GY3, respectively. The unselected voltage supply circuits 421, 422, and 423 may apply the second unselected bit line bias voltage BUSV2 to the first to fourth bit lines BL1, BL2, BL3, BL4, BL5, BL6, BL7, BL8, BL9, BL10, BL11, and BL12 of the first to third bit line groups BG1, BG2, and BG3 when the first to third group select signals GY1, GY2, and GY3 are disabled. For example, when the second group select signal GY2 is enabled and the first and third group select signals GY1 and GY3 are disabled, the unselected voltage supply circuit 421 may drive the first to fourth bit lines BL1, BL2, BL3, and BL4 of the first bit line group BG1 with the second unselected bit line bias voltage BUSV2, and the unselected voltage supply circuit 423 may drive the first to fourth bit lines BL9, BL10, BL11, and BL12 of the third bit line group BG3 with the second unselected bit line bias voltage BUSV2. The unselected voltage supply circuit 422 might not apply the second unselected bit line bias voltage BUSV2 to the first to fourth bit lines BL5, BL6, BL7, and BL8 of the second bit line group BG2.

In an embodiment, the different bit line bias voltages may include the selected bit line bias voltage BSV, the first unselected bit line bias voltage BUSV1, and the second unselected bit line bias voltage BUSV2. The bit line control circuit 402 may apply the selected bit line bias voltage BSV to a global bit line to which a bit line selected based on the bit line select signal BLS is coupled. The bit line control circuit 402 may apply the first unselected bit line bias voltage BUSV1 to a global bit line to which a bit line adjacent to a bit line selected based on the bit line select signal BLS is coupled. The bit line control circuit 402 may apply the second unselected bit line bias voltage BUSV2 to a global bit line to which a bit line not adjacent to a bit line selected based on the bit line select signal BLS is coupled. For example, when the second bit line BL6 of the second bit line group BG2 is selected based on the bit line select signal BLS, the bit line control circuit 402 may apply the selected bit line bias voltage BSV to the second global bit line GBL2 which is coupled with the second bit line BL6. The bit line control circuit 402 may apply the first unselected bit line bias voltage BUSV1 to the first global bit line GBL1 and the third global bit line GBL3 which are respectively coupled with the first bit line BL5 and the third bit line BL7 adjacent to the second bit line BL6. The bit line control circuit 402 may apply the second unselected bit line bias voltage BUSV2 to the fourth global bit line GBL4 which is coupled with the fourth bit line BL8 not adjacent to the second bit line BL6.

In an embodiment, the different bit line bias voltages may include the selected bit line bias voltage BSV, the first unselected bit line bias voltage BUSV1, and the third unselected bit line bias voltage BUSV3. The bit line control circuit 402 may apply the selected bit line bias voltage BSV to a global bit line to which a bit line selected based on the bit line select signal BLS is coupled. The bit line control circuit 402 may apply the first unselected bit line bias voltage BUSV1 to a global bit line to which a bit line adjacent to a bit line selected based on the bit line select signal BLS is coupled. The bit line control circuit 402 may apply the third unselected bit line bias voltage BUSV3 to a global bit line to which a bit line not directly adjacent to a bit line selected based on the bit line select signal BLS but adjacent to a bit line directly adjacent to the bit line selected based on the bit line select signal BLS is coupled. For example, when the second bit line BL6 of the second bit line group BG2 is selected based on the bit line select signal BLS, the bit line control circuit 402 may apply the selected bit line bias voltage BSV to the second global bit line GBL2 which is coupled with the second bit line BL6. The bit line control circuit 402 may apply the first unselected bit line bias voltage BUSV1 to the first global bit line GBL1 and the third global bit line GBL3 which are respectively coupled with the first bit line BL5 and the third bit line BL7 adjacent to the second bit line BL6. The bit line control circuit 402 may apply the third unselected bit line bias voltage BUSV3 to the fourth global bit line GBL4 which is coupled with the fourth bit line BL8 not adjacent to the second bit line BL6 but adjacent to the third bit line BL7.

Figure 7:
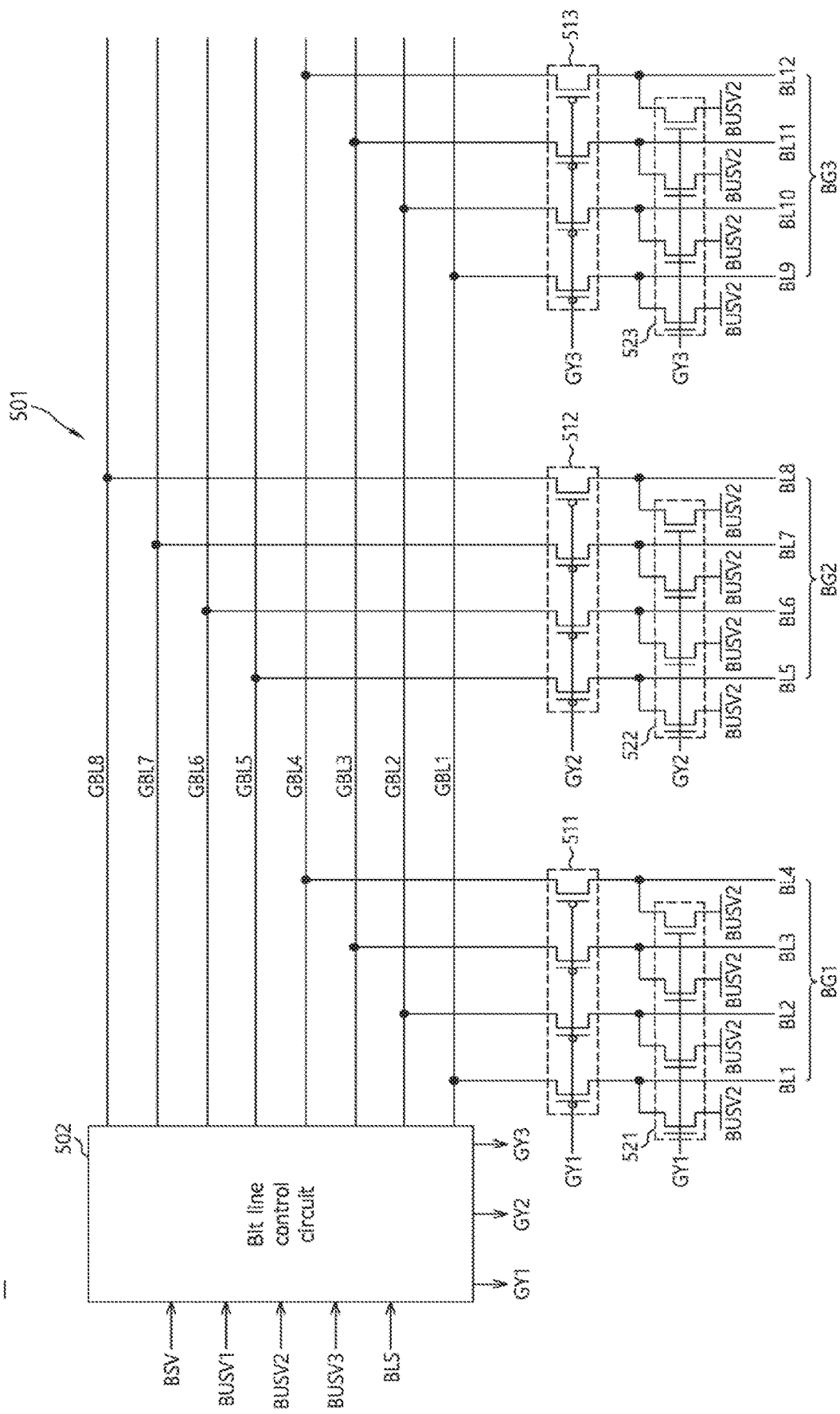
FIG. 7 shows a diagram illustrating a configuration of a semiconductor memory apparatus in accordance with an embodiment.

FIG. 7 shows a diagram illustrating a configuration of a semiconductor memory apparatus 5 in accordance with an embodiment. In FIG. 7, the semiconductor memory apparatus 5 may include a memory cell array 501 and a bit line control circuit 502. The memory cell array 501 may include a plurality of global bit lines and a plurality of bit lines. The plurality of bit lines may be a plurality of access lines. The bit line control unit may be an access line control circuit. In FIG. 7, the memory cell array 501 may include a first global bit line GBL1, a second global bit line GBL2, a third global bit line GBL3, a fourth global bit line GBL4, a fifth global bit line GBL5, a sixth global bit line GBL6, a seventh global bit line GBL7, and an eighth global bit line GBL8. The memory cell array 501 may include a plurality of bit line groups. The plurality of bit line groups may include a first bit line group BG1, a second bit line group BG2, and a third bit line group BG3, and each of the first to third bit line groups BG1, BG2, and BG3 may include bit lines the number of which corresponds to half the number of global bit lines. Each of the first to third bit line groups BG1, 13G2, and BG3 may include four bit lines. First to fourth bit lines BL1, BL2, BL3, and BL4 of the first bit line group BG1 may be coupled with the first to fourth global bit lines GBL1, GBL2, GBL3, and GBL4, respectively. First to fourth bit lines BL5, BL6, BL7, and BL8 of the second bit line group BG2 may be coupled with the fifth to eighth global bit lines GBL5, GBL6, GBL7, and GBL8, respectively, and the first bit line BL5 of the second bit line group BG2 may be adjacent to the fourth bit line BL4 of the first bit line group BG1. First to fourth bit lines BL9, BL10, BL11, and BL12 of the third bit line group BG3 may be coupled with the first to fourth global bit lines GBL1, GBL2, GBL3, and GBL4, respectively, and the first bit line BL9 of the third bit line group BG3 may be adjacent to the fourth bit line BL8 of the second bit line group BG2. While FIG. 7 shows three bit line groups, other embodiments are not so limited and may have four or more bit line groups. For example, if a fourth bit line group adjacent to the third bit line group BG3 exists, the bit lines of the fourth bit line group may be coupled with the fifth to eighth global bit lines GBL5, GBL6, GBL7, and GBL8, respectively, similarly to the second bit line group BG2.

The memory cell array 501 may include a first group switch 511, a second group switch 512, and a third group switch 513. The first group switch 511 may couple the first to fourth bit lines BL1, BL2, BL3, and BL4 of the first bit line group BG1 with the first to fourth global bit lines GBL1, GBL2, GBL3, and GBL4, respectively, based on a first group select signal GY1. The second group switch 512 may couple the first to fourth bit lines BL5, BL6, BL7, and BL8 of the second bit line group BG2 with the fifth to eighth global bit lines GBL5, GBL6, GBL7, and GBL8, respectively, based on a second group select signal GY2. The third group switch 513 may couple the first to fourth bit lines BL9, BL10, BL11, and BL12 of the third bit line group BG3 with the first to fourth global bit lines GBL1, GBL2, GBL3, and GBL4, respectively, based on a third group select signal GY3.

The bit line control circuit 502 may receive a bit line select signal BLS. The bit line control circuit 502 may generate the first to third group select signals GY1, GY2, and GY3 based on the bit line select signal BLS. The bit line control circuit 502 may selectively enable the first to third group select signals GY1, GY2, and GY3 to select a bit line group which includes a selected bit line. The bit line control circuit 502 may enable at least one group select signal based on the bit line select signal BLS. When a specific bit line is selected, the bit line control circuit 502 may enable together not only a group select signal of a bit line group to which the selected bit line belongs but also a group select signal of another bit line group to which a bit line adjacent to the selected bit line belongs. For example, when one of the first to third bit lines BL1, BL2, and BL3 of the first bit line group BG1 is selected based on the bit line select signal BLS, the bit line control circuit 502 may enable the first group select signal GY1. When one of the second and third bit lines BL6 and BL7 of the second bit line group BG2 is selected based on the bit line select signal BLS, the bit line control circuit 502 may enable the second group select signal GY2. When any one of the second to fourth bit lines BL10, BL11, and BL12 of the third bit line group BG3 is selected based on the bit line select signal BLS, the bit line control circuit 502 may enable the third group select signal GY3. When the fourth bit line BL4 of the first bit line group BG1 or the first bit line BL5 of the second bit line group BG2 is selected based on the bit line select signal BLS, the bit line control circuit 502 may enable the first group select signal GY1 and the second group select signal GY2 together. When the fourth bit line BL8 of the second bit line group BG2 or the first bit line BL9 of the third bit line group BG3 is selected based on the bit line select signal BLS, the bit line control circuit 502 may enable the second group select signal GY2 and the third group select signal GY3 together.

The bit line control circuit 502 may drive all or some of the first to eighth global bit lines GBL1, GBL2, GBL3, GBL4, GBL5, GBL6, GBL7, and GBL8 with different bit line bias voltages based on the bit line select signal BLS. The different bit line bias voltages may include all or some of a selected bit line bias voltage BSV, a first unselected bit line bias voltage BUSV1, a second unselected bit line bias voltage BUSV2, and a third unselected bit line bias voltage BUSV3. In an embodiment, the different bit line bias voltages may include the selected bit line bias voltage BSV and the first unselected bit line bias voltage BUSV1. The bit line control circuit 502 may apply the selected bit line bias voltage BSV to a global bit line to which a bit line selected based on the bit line select signal BLS is coupled. The bit line control circuit 502 may apply the first unselected bit line bias voltage BUSV1 to global bit lines which are not coupled with a bit line selected based on the bit line select signal BLS.

In an embodiment, the different bit line bias voltages may include the selected bit line bias voltage BSV, the first unselected bit line bias voltage BUSV1, and the second unselected bit line bias voltage BUSV2. The bit line control circuit 502 may apply the selected bit line bias voltage BSV to a global bit line to which a bit line selected based on the bit line select signal BLS is coupled. The bit line control circuit 502 may apply the first unselected bit line bias voltage BUSV1 to a global bit line to which a bit line adjacent to a bit line selected based on the bit line select signal BLS is coupled. The bit line control circuit 502 may apply the second unselected bit line bias voltage BUSV2 to a global bit line to which a bit line not adjacent to a bit line selected based on the bit line select signal BLS is coupled.

In an embodiment, the different bit line bias voltages may include the selected bit line bias voltage BSV, the first unselected bit line bias voltage BUSV1, and the third unselected bit line bias voltage BUSV3. The bit line control circuit 502 may apply the selected bit line bias voltage BSV to a global bit line to which a bit line selected based on the bit line select signal BLS is coupled. The bit line control circuit 502 may apply the first unselected bit line bias voltage BUSV1 to a global bit line to which a bit line adjacent to a bit line selected based on the bit line select signal BLS is coupled. The bit line control circuit 502 may apply the third unselected bit line bias voltage BUSV3 to a global bit line to which a bit line not directly adjacent to a bit line selected based on the bit line select signal BLS but adjacent to a bit line directly adjacent to the bit line selected based on the bit line select signal BLS is coupled.

The memory cell array 501 may include unselected voltage supply circuits 521, 522, and 523. The unselected voltage supply circuits 521, 522, and 523 may be coupled with the first to third bit line groups BG1, BG2, and BG3, respectively. The unselected voltage supply circuits 521, 522, and 523 may apply the second unselected bit line bias voltage BUSV2 to the first to fourth bit lines BL1, BL2, BL3, BL4, BL5, BL6, BL7, BL8, BL9, BL10, BL11, and BL12 of the first to third bit line groups BG1, BG2, and BG3 based on the first group select signal GY1, the second group select signal GY2, and the third group select signal GY3, respectively. The unselected voltage supply circuits 521, 522, and 523 may apply the second unselected bit line bias voltage BUSV2 to the first to fourth bit lines BL1, BL2, BL3, BL4, BL5, BL6, BL7, BL8, BL9, BL10, BL11, and BL12 of the first to third bit line groups BG1, BG2, and BG3 when the first to third group select signals GY1, GY2, and GY3 are disabled. For example, when the second group select signal GY2 is enabled and the first and third group select signals GY1 and GY3 are disabled, the unselected voltage supply circuit 521 may drive the first to fourth bit lines BL1, BL2, BL3, and BL4 of the first bit line group BG1 with the second unselected bit line bias voltage BUSV2, and the unselected voltage supply circuit 523 may drive the first to fourth bit lines BL9, BL10, BL11, and BL12 of the third bit line group BG3 with the second unselected bit line bias voltage BUSV2. The unselected voltage supply circuit 522 might not apply the second unselected bit line bias voltage BUSV2 to the first to fourth bit lines BL5, BL6, BL7, and BL8 of the second bit line group BG2.

The operation of the semiconductor memory apparatus 5 in accordance with an embodiment is described below. When the second bit line BL6 of the second bit line group BG2 is selected based on the bit line select signal BLS, the bit line control circuit 502 may enable the second group select signal GY2 and disable the first and third group select signals GY1 and GY3. The unselected voltage supply circuits 521 and 523 may apply the second unselected bit line bias voltage BUSV2 to the first to fourth bit lines BL1, BL2, BL3, and BL4 of the first bit line group BG1 and the first to fourth bit lines BL9, BL10, BL11, and BL12 of the third bit line group BG3, based on the first and third group select signals GY1 and GY3 which are disabled. When the second bit line BL6 is selected based on the bit line select signal BLS, the bit line control circuit 502 may apply the selected bit line bias voltage BSV to the sixth global bit line GBL6, and may apply the first unselected bit line bias voltage BUSV1 to the fifth global bit line GBL5, the seventh global bit line GBL7 and the eighth global bit line GBL8. In an embodiment, the bit line control circuit 502 may apply the selected bit line bias voltage BSV to the sixth global bit line GBL6, may apply the first unselected bit line bias voltage BUSV1 to the fifth global bit line GBL5 and the seventh global bit line GBL7, and may apply the second unselected bit line bias voltage BUSV2 to the eighth global bit line GBL8. In an embodiment, the bit line control circuit 502 may apply the selected bit line bias voltage BSV to the sixth global bit line GBL6, may apply the first unselected bit line bias voltage BUSV1 to the fifth global bit line GBL5 and the seventh global bit line GBL7, and may apply the third unselected bit line bias voltage BUSV3 to the eighth global bit line GBL8.

Therefore, the selected second bit line BL6 may be coupled with the sixth global bit line GBL6 and be driven with the selected bit line bias voltage BSV, and the first and third bit lines BL5 and BL7 which are adjacent to the second bit line BL6 among unselected bit lines may be respectively coupled with the fifth and seventh global bit lines GBL5 and GBL7 and be driven with the first unselected bit line bias voltage BUSV1. The first to fourth bit lines BL1, BL2, BL3, and BL4 of the first bit line group BG1 and the first to fourth bit lines BL9, BL10, BL11, and BL12 of the third bit line group BG3 which are not adjacent to the second bit line BL6 may be driven with the second unselected bit line bias voltage BUSV2, and the fourth bit line BL8 of the second bit line group BG2 may be coupled with the eighth global bit line GBL8 and be driven with one of the first to third unselected bit line bias voltages BUSV1, BUSV2, and BUSV3. The first and third bit lines BL5 and BL7 which are adjacent to the selected second bit line BL6 may be driven with the first unselected bit line bias voltage BUSV1 which has a level lower than the second unselected bit line bias voltage BUSV2, and may prevent or mitigate the occurrence of a disturbance of memory cells which are coupled with the first and third bit lines BL5 and BL7. The bit line control circuit 502 may perform an operation similar to that described above when the first to third bit lines BL1, BL2, and BL3 of the first bit line group BG1, the third bit line BL7 of the second bit line group BG2 and the second to fourth bit lines BL10, BL11, and BL12 of the third bit line group BG3 are selected.

When the first bit line BL5 of the second bit line group BG2 is selected based on the bit line select signal BLS, the bit line control circuit 502 may enable both the first and second group select signals GY1 and GY2 and disable the third group select signal GY3. The unselected voltage supply circuit 523 may apply the second unselected bit line bias voltage BUSV2 to the first to fourth bit lines BL9, BL10, BL11, and BL12 of the third bit line group BG3 based on the disabled third group select signal GY3. The bit line control circuit 502 may apply the selected bit line bias voltage BSV to the fifth global bit line GBL5 which is coupled with the first bit line BL5 of the second bit line group BG2. The bit line control circuit 502 may apply the first unselected bit line bias voltage BUSV1 to the fourth global bit line GBL4 which is coupled with the fourth bit line BL4 of the first bit line group BG1 adjacent to the first bit line BL5 and the sixth global bit line GBL6 which is coupled with the second bit line BL6 of the second bit line group BG2 adjacent to the first bit line BL5. The bit line control circuit 502 may apply one of the first to third unselected bit line bias voltages BUSV1, BUSV2, and BUSV3 to the first to third global bit lines GBL1, GBL2, and GBL3 which are coupled with the first to third bit lines BL1, BL2, and BL3 of the first bit line group BG1 not adjacent to the first bit line BL5 and the seventh and eighth global bit lines GBL7 and GBL8 which are coupled with the third and fourth bit lines BL7 and BL8 of the second bit line group BG2 not adjacent to the first bit line BL5. While a voltage to be applied to the first to third global bit lines GBL1, GBL2, and GBL3 and the seventh and eighth global bit lines GBL7 and GBL8 may be any one of the first to third unselected bit line bias voltages BUSV1, BUSV2, and BUSV3, an unselected bit line bias voltage which has a relatively low level as the position of an unselected bit line is close to a selected bit line may be applied to the global bit line which is coupled with the unselected bit line. For example, the bit line control circuit 502 may apply the first unselected bit line bias voltage BUSV1 to the fourth and sixth global bit lines GBL4 and GBL6, may apply the third unselected bit line bias voltage BUSV3 to the third and seventh global bit lines GBL3 and GBL7, and may apply the second unselected bit line bias voltage BUSV2 to the first, second and eighth global bit lines GBL1, GBL2, and GBL8. The bit line control circuit 502 may perform an operation similar to that described above when the fourth bit line BL4 of the first bit line group BG1, the fourth bit line BL8 of the second bit line group BG2 and the first bit line BL9 of the third bit line group BG3 are selected.

Figure 8:
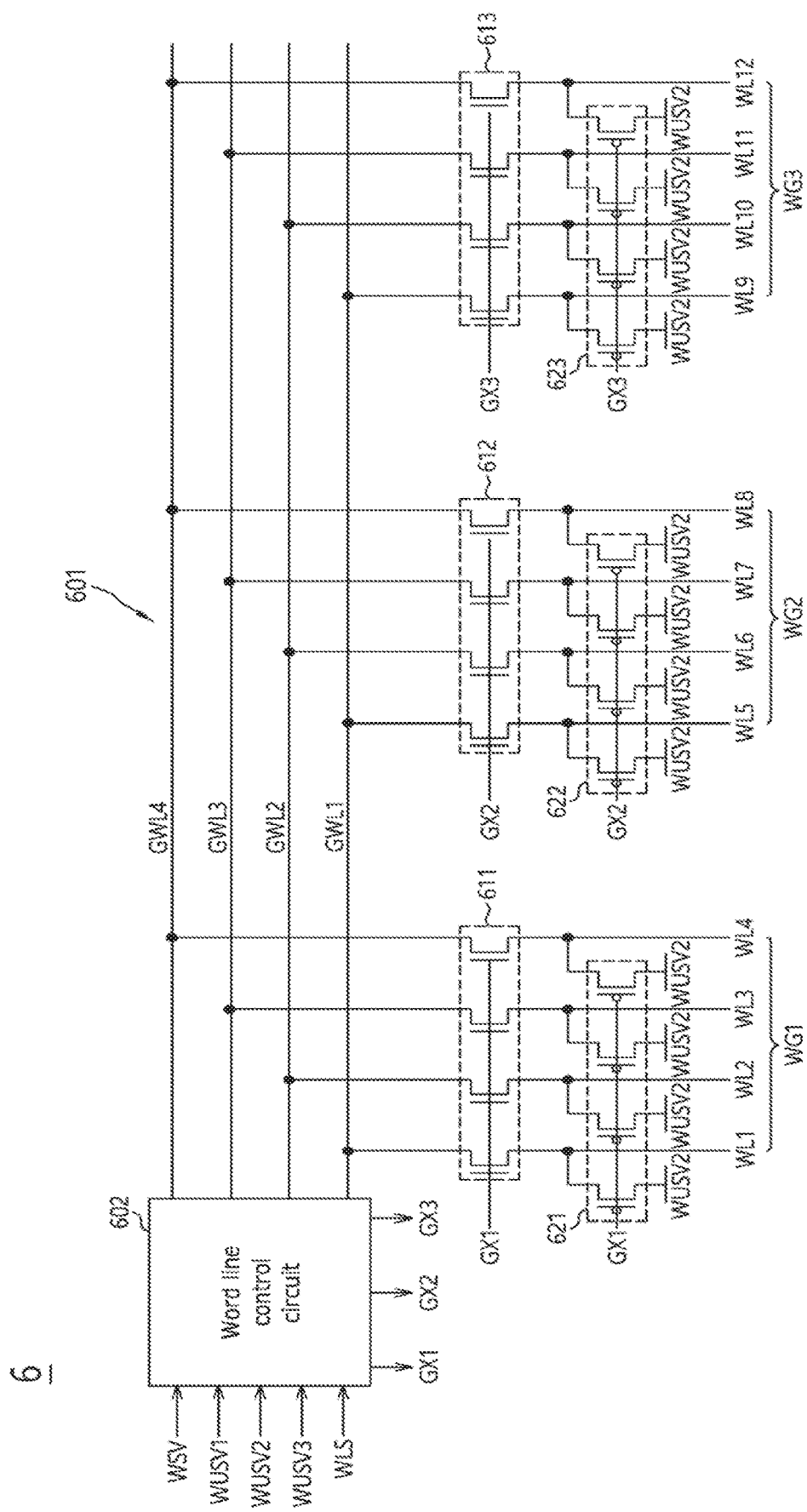
FIG. 8 shows a diagram illustrating a configuration of a semiconductor memory apparatus in accordance with an embodiment.

FIG. 8 shows a diagram illustrating a configuration of a semiconductor memory apparatus 6 in accordance with an embodiment. In FIG. 8, the semiconductor memory apparatus 6 may include a memory cell array 601 and a word line control circuit 602. The memory cell array 601 may include a plurality of global word lines and a plurality of word lines. The plurality of word lines may be a plurality of access lines. The word line control unit may be an access line control circuit. In FIG. 8, the memory cell array 601 may include a first global word line GWL1, a second global word line GWL2, a third global word line GWL3, and a fourth global word line GWL4. The memory cell array 601 may include a plurality of word line groups. The plurality of word line groups may include a first word line group WG1, a second word line group WG2, and a third word line group WG3, and each of the first to third word line groups WG1, WG2, and WG3 may include word lines the number of which corresponds to the number of global word lines. Each of the first to third word line groups WG1, WG2, and WG3 may include four word lines. First to fourth word lines WL1, WL2, WL3, and WL4 of the first word line group WG1 may be coupled with the first to fourth global word lines GWL1, GWL2, GWL3, and GWL4, respectively. First to fourth word lines WL5, WL6, WL7, and WL8 of the second word line group WG2 may be coupled with the first to fourth global word lines GWL1, GWL2, GWL3, and GWL4, respectively, and the first word line WL5 of the second word line group WG2 may be adjacent to the fourth word line WL4 of the first word line group WG1. First to fourth word lines WL9, WL10, WL11, and WL12 of the third word line group WG3 may be coupled with the first to fourth global word lines GWL1, GWL2, GWL3, and GWL4, respectively, and the first word line WL9 of the third word line group WG3 may be adjacent to the fourth word line WL8 of the second word line group WG2. While FIG. 8 shows three word line groups, other embodiments are not so limited and may have four or more word line groups. Also, while it is illustrated that the number of global word lines and the number of word lines which are included in each word line group are 4, the number of global word lines and the number of word lines which are included in each word line group may be greater or less than 4 in other embodiments.

The memory cell array 601 may include a first group switch 611, a second group switch 612, and a third group switch 613. The first group switch 611 may couple the first to fourth word lines WL1, WL2, WL3, and WL4 of the first word line group WG1 with the first to fourth global word lines GWL1, GWL2, GWL3, and GWL4, respectively, based on a first group select signal GX1. The second group switch 612 may couple the first to fourth word lines WL5, WL6, WL7, and WL8 of the second word line group WG2 with the first to fourth global word lines GWL1, GWL2, GWL3, and GWL4, respectively, based on a second group select signal GX2. The third group switch 613 may couple the first to fourth word lines WL9, WL10, WL11, and WL12 of the third word line group WG3 with the first to fourth global word lines GWL1, GWL2, GWL3, and GWL4, respectively, based on a third group select signal GX3.

The word line control circuit 602 may receive a word line select signal WLS. The word line control circuit 602 may generate the first to third group select signals GX1, GX2, and GX3 based on the word line select signal WLS. The word line control circuit 602 may selectively enable the first to third group select signals GX1, GX2, and GX3 to select a word line group in which a word line selected based on the word line select signal WLS is included.

The word line control circuit 602 may drive the first to fourth global word lines GWL1, GWL2, GWL3, and GWL4 with different word line bias voltages based on the word line select signal WLS. The different word line bias voltages may include all or some of a selected word line bias voltage WSV, a first unselected word line bias voltage WUSV1, a second unselected word line bias voltage WUSV2, and a third unselected word line bias voltage WUSV3. In an embodiment, the different word line bias voltages may include the selected word line bias voltage WSV and the first unselected word line bias voltage WUSV1. The word line control circuit 602 may apply the selected word line bias voltage WSV to a global word line to which a word line selected based on the word line select signal WLS is coupled. The word line control circuit 602 may apply the first unselected word line bias voltage WUSV1 to global word lines which are not coupled with a word line selected based on the word line select signal WLS. For example, when the second word line WL6 of the second word line group WG2 is selected based on the word line select signal WLS, the word line control circuit 602 may apply the selected word line bias voltage WSV to the second global word line GWL2 which is coupled with the second word line WL6, and may apply the first unselected word line bias voltage WUSV1 to the first global word line GWL1, the third global word line GWL3, and the fourth global word line GWL4.

In an embodiment, the different word line bias voltages may include the selected word line bias voltage WSV, the first unselected word line bias voltage WUSV1, and the second unselected word line bias voltage WUSV2. The word line control circuit 602 may apply the selected word line bias voltage WSV to a global word line to which a word line selected based on the word line select signal WLS is coupled. The word line control circuit 602 may apply the first unselected word line bias voltage WUSV1 to a global word line to which a word line adjacent to a word line selected based on the word line select signal WLS is coupled. The word line control circuit 602 may apply the second unselected word line bias voltage WUSV2 to a global word line to which a word line not adjacent to a word line selected based on the word line select signal WLS is coupled. For example, when the second word line WL6 of the second word line group WG2 is selected based on the word line select signal WLS, the word line control circuit 602 may apply the selected word line bias voltage WSV to the second global word line GWL2 which is coupled with the second word line WL6. The word line control circuit 602 may apply the first unselected word line bias voltage WUSV1 to the first global word line GWL1 and the third global word line GWL3 which are respectively coupled with the first word line WL5 and the third word line WL7 adjacent to the second word line WL6. The word line control circuit 602 may apply the second unselected word line bias voltage WUSV2 to the fourth global word line GWL4 which is coupled with the fourth word line WL8 not adjacent to the second word line WL6.

In an embodiment, the different word line bias voltages may include the selected word line bias voltage WSV, the first unselected word line bias voltage WUSV1, and the third unselected word line bias voltage WUSV3. The word line control circuit 602 may apply the selected word line bias voltage WSV to a global word line to which a word line selected based on the word line select signal WLS is coupled. The word line control circuit 602 may apply the first unselected word line bias voltage WUSV1 to a global word line to which a word line adjacent to a word line selected based on the word line select signal WLS is coupled. The word line control circuit 602 may apply the third unselected word line bias voltage WUSV3 to a global word line to which a word line not directly adjacent to a word line selected based on the word line select signal WLS but adjacent to a word line directly adjacent to the word line selected based on the word line select signal WLS is coupled. For example, when the second word line WL6 of the second word line group WG2 is selected based on the word line select signal WLS, the word line control circuit 602 may apply the selected word line bias voltage WSV to the second global word line GWL2 which is coupled with the second word line WL6. The word line control circuit 602 may apply the first unselected word line bias voltage WUSV1 to the first global word line GWL1 and the third global word line GWL3 which are respectively coupled with the first word line WL5 and the third word line WL7 adjacent to the second word line WL6. The word line control circuit 602 may apply the third unselected word line bias voltage WUSV3 to the fourth global word line GWL4 which is coupled with the fourth word line WL8 not adjacent to the second word line WL6 but adjacent to the third word line WL7.

The memory cell array 601 may include unselected voltage supply circuits 621, 622, and 623. The unselected voltage supply to circuits 621, 622, and 623 may apply the second unselected word line bias voltage WUSV2 to the first to fourth word lines WL1, WL2, WL3, WL4, WL5, WL6, WL7, WL8, WL9, WL10, WL11, and WL12 of the first to third word line groups WG1, WG2, and WG3 based on the first group select signal GX1, the second group select signal GX2, and the third group select signal GX3, respectively. The unselected voltage supply circuits 621, 622, and 623 may apply the second unselected word line bias voltage WUSV2 to the first to fourth word lines WL1, WL2, WL3, WL4, WL5, WL6, WL7, WL8, WL9, WL10, WL11, and WL12 of the first to third word line groups WG1, WG2, and WG3 when the first to third group select signals GX1, GX2, and GX3 are disabled.

Figure 9:
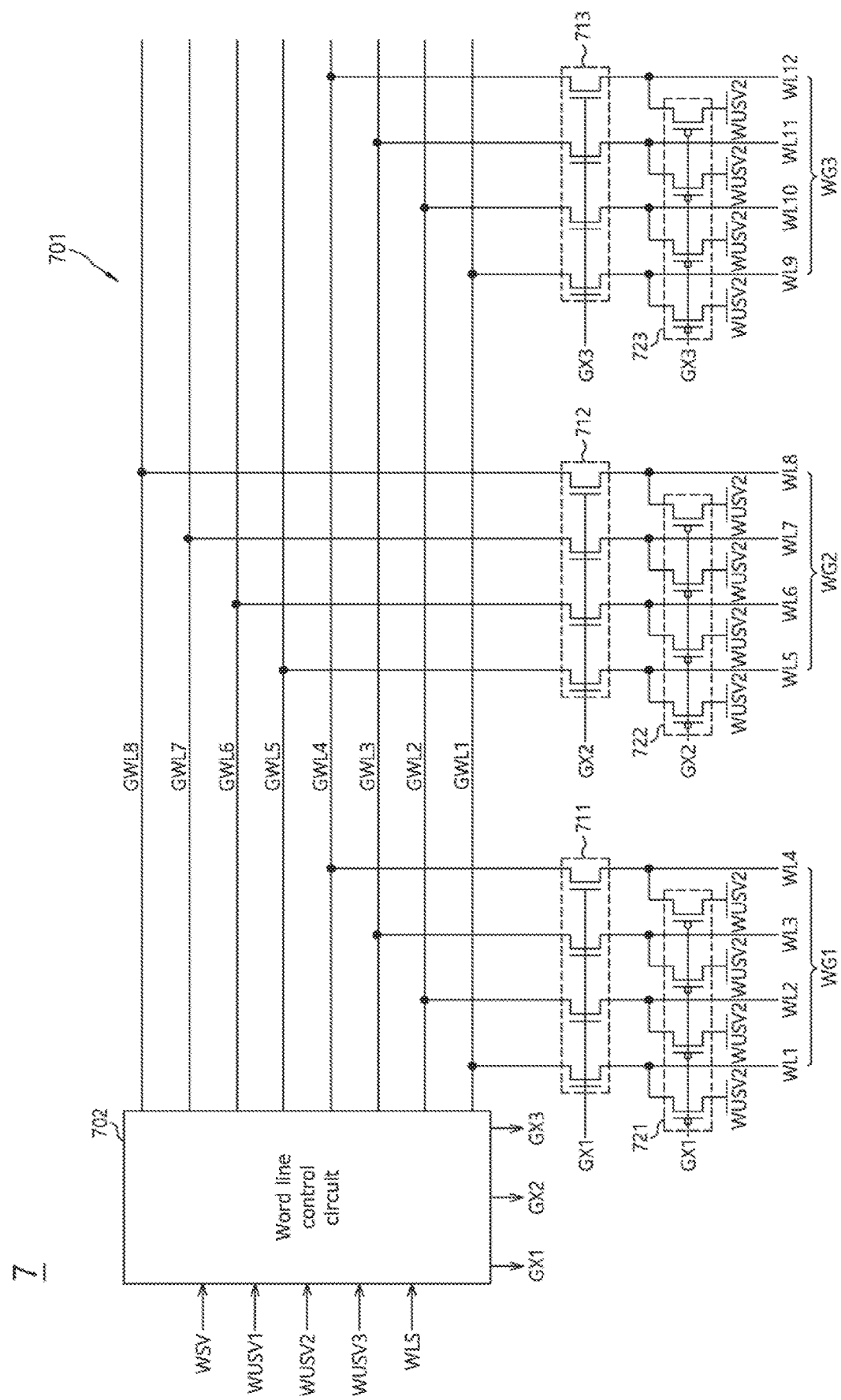
FIG. 9 shows a diagram illustrating a configuration of a semiconductor memory apparatus in accordance with an embodiment.

FIG. 9 shows a diagram illustrating a configuration of a semiconductor memory apparatus 7 in accordance with an embodiment. In FIG. 9, the semiconductor memory apparatus 7 may include a memory cell array 701 and a word line control circuit 702. The memory cell array 701 may include a plurality of global word lines and a plurality of word lines. The plurality of word lines may be a plurality of access lines. The word line control unit may be an access line control circuit. In FIG. 9, the memory cell array 701 may include a first global word line GWL1, a second global word line GWL2, a third global word line GWL3, a fourth global word line GWL4, a fifth global word line GWL5, a sixth global word line GWL6, a seventh global word line GWL7, and an eighth global word line GWL8. The memory cell array 701 may include a plurality of word line groups. The plurality of word line groups may include a first word line group WG1, a second word line group WG2, and a third word line group WG3, and each of the first to third word line groups WG1, WG2, and WG3 may include word lines the number of which corresponds to half the number of global word lines. Each of the first to third word line groups WG1, WG2, and WG3 may include four word lines. First to fourth word lines WL1, WL2, WL3, and WL4 of the first word line group WG1 may be coupled with the first to fourth global word lines GWL1, GWL2, GWL3, and GWL4, respectively. First to fourth word lines WL5, WL6, WL7, and WL8 of the second word line group WG2 may be coupled with the fifth to eighth global word lines GWL5, GWL6, GWL7, and GWL8, respectively, and the first word line WL5 of the second word line group WG2 may be adjacent to the fourth word line WL4 of the first word line group WG1. First to fourth word lines WL9, WL10, WL11, and WL12 of the third word line group WG3 may be coupled with the first to fourth global word lines GWL1, GWL2, GWL3, and GWL4, respectively, and the first word line WL9 of the third word line group WG3 may be adjacent to the fourth word line WL8 of the second word line group WG2. While FIG. 9 shows three word line groups, other embodiments are not so limited and may have four or more word line groups. For example, if a fourth word line group which is adjacent to the third word line group WG3 exists, the word lines of the fourth word line group may be coupled with the fifth to eighth global word lines GWL5, GWL6, GWL7, and GWL8, respectively, similarly to the second word line group WG2.

The memory cell array 701 may include a first group switch 711, a second group switch 712, and a third group switch 713. The first group switch 711 may couple the first to fourth word lines WL1, WL2, WL3, and WL4 of the first word line group WG1 with the first to fourth global word lines GWL1, GWL2, GWL3, and GWL4, respectively, based on a first group select signal GX1. The second group switch 712 may couple the first to fourth word lines WL5, WL6, WL7, and WL8 of the second word line group WG2 with the fifth to eighth global word lines GWL5, GWL6, GWL7, and GWL8, respectively, based on a second group select signal GX2. The third group switch 713 may couple the first to fourth word lines WL9, WL10, WL11, and WL12 of the third word line group WG3 with the first to fourth global word lines GWL1, GWL2, GWL3, and GWL4, respectively, based on a third group select signal GX3.

The word line control circuit 702 may receive a word line select signal WLS. The word line control circuit 702 may generate the first to third group select signals GX1, GX2, and GX3 based on the word line select signal WLS. The word line control circuit 702 may selectively enable the first to third group select signals GX1, GX2, and GX3 based on the word line select signal WLS. The word line control circuit 702 may enable at least one group select signal based on the word line select signal WLS. When a specific word line is selected, the word line control circuit 702 may enable together not only a group select signal of a word line group which includes the selected word line but also a group select signal of another word line group to which a word line adjacent to the selected word line belongs. For example, when one of the first to third word lines WL1, WL2, and WL3 of the first word line group WG1 is selected based on the word line select signal WLS, the word line control circuit 702 may enable the first group select signal GX1. When one of the second and third word lines WL6 and WL7 of the second word line group WG2 is selected based on the word line select signal WLS, the word line control circuit 702 may enable the second group select signal GX2. When any one of the second to fourth word lines WL10, WL11, and WL12 of the third word line group WG3 is selected based on the word line select signal WLS, the word line control circuit 702 may enable the third group select signal GX3. When the fourth word line WL4 of the first word line group WG1 or the first word line WL5 of the second word line group WG2 is selected based on the word line select signal WLS, the word line control circuit 702 may enable the first group select signal GX1 and the second group select signal GX2 together. When the fourth word line WL8 of the second word line group WG2 or the first word line WL9 of the third word line group WG3 is selected based on the word line select signal WLS, the word line control circuit 702 may enable the second group select signal GX2 and the third group select signal GX3 together.

The word line control circuit 702 may drive all or some of the first to eighth global word lines GWL1, GWL2, GWL3, GWL4, GWL5, GWL6, GWL7, and GWL8 with different word line bias voltages based on the word line select signal WLS. The different word line bias voltages may include all or some of a selected word line bias voltage WSV, a first unselected word line bias voltage WUSV1, a second unselected word line bias voltage WUSV2, and a third unselected word line bias voltage WUSV3. In an embodiment, the different word line bias voltages may include the selected word line bias voltage WSV and the first unselected word line bias voltage WUSV1. The word line control circuit 702 may apply the selected word line bias voltage WSV to a global word line to which a word line selected based on the word line select signal WLS is coupled. The word line control circuit 702 may apply the first unselected word line bias voltage WUSV1 to global word lines which are not coupled with a word line selected based on the word line select signal WLS.

In an embodiment, the different word line bias voltages may include the selected word line bias voltage WSV, the first unselected word line bias voltage WUSV1, and the second unselected word line bias voltage WUSV2. The word line control circuit 702 may apply the selected word line bias voltage WSV to a global word line to which a word line selected based on the word line select signal WLS is coupled. The word line control circuit 702 may apply the first unselected word line bias voltage WUSV1 to a global word line to which a word line adjacent to a word line selected based on the word line select signal WLS is coupled. The word line control circuit 702 may apply the second unselected word line bias voltage WUSV2 to a global word line to which a word line not adjacent to a word line selected based on the word line select signal WLS is coupled.

In an embodiment, the different word line bias voltages may include the selected word line bias voltage WSV, the first unselected word line bias voltage WUSV1, and the third unselected word line bias voltage WUSV3. The word line control circuit 702 may apply the selected word line bias voltage WSV to a global word line to which a word line selected based on the word line select signal WLS is coupled. The word line control circuit 702 may apply the first unselected word line bias voltage WUSV1 to a global word line to which a word line adjacent to a word line selected based on the word line select signal WLS is coupled. The word line control circuit 702 may apply the third unselected word line bias voltage WUSV3 to a global word line to which a word line not directly adjacent to a word line selected based on the word line select signal WLS but adjacent to a word line directly adjacent to the word line selected based on the word line select signal WLS is coupled.

The memory cell array 701 may include unselected voltage supply circuits 721, 722, and 723. The unselected voltage supply circuits 721, 722, and 723 may apply the second unselected word line bias voltage WUSV2 to the first to fourth word lines WL1, WL2, WL3, WL4, WL5, WL6, WL7, WL8, WL9, WL10, WL11, and WL12 of the first to third word line groups WG1, WG2, and WG3 based on the first group select signal GX1, the second group select signal GX2 and the third group select signal GX3, respectively. The unselected voltage supply circuits 721, 722, and 723 may apply the second unselected word line bias voltage WUSV2 to the first to fourth word lines WL1, WL2, WL3, WL4, WL5, WL6, WL7, WL8, WL9, WL10, WL11, and WL12 of the first to third word line groups WG1, WG2, and WG3 when the first to third group select signals GX1, GX2, and GX3 are disabled. For example, when the second group select signal GX2 is enabled and the first and third group select signals GX1 and GX3 are disabled, the unselected voltage supply circuit 721 may drive the first to fourth word lines WL1, WL2, WL3, and WL4 of the first word line group WG1 with the second unselected word line bias voltage WUSV2, and the unselected voltage supply circuit 723 may drive the first to fourth word lines WL9, WL10, WL11, and WL12 of the third word line group WG3 with the second unselected word line bias voltage WUSV2. The unselected voltage supply circuit 722 might not apply the second unselected word line bias voltage WUSV2 to the first to fourth word lines WL5, WL6, WL7, and WL8 of the second word line group WG2.

The operation of the semiconductor memory apparatus 7 in accordance with an embodiment is described below. When the second word line WL6 of the second word line group WG2 is selected based on the word line select signal WLS, the word line control circuit 702 may enable the second group select signal GX2 and disable the first and third group select signals GX1 and GX3. The unselected voltage supply circuits 721 and 723 may apply the second unselected word line bias voltage WUSV2 to the first to fourth word lines WL1, WL2, WL3, and WL4 of the first word line group WG1 and the first to fourth word lines WL9, WL10, WL11, and WL12 of the third word line group WG3, based on the first and third group select signals GX1 and GX3 which are disabled. When the second word line WL6 is selected based on the word line select signal WLS, the word line control circuit 702 may apply the selected word line bias voltage WSV to the sixth global word line GWL6, and may apply the first unselected word line bias voltage WUSV1 to the fifth global word line GWL5, the seventh global word line GWL7, and the eighth global word line GWL8. In an embodiment, the word line control circuit 702 may apply the selected word line bias voltage WSV to the sixth global word line GWL6, may apply the first unselected word line bias voltage WUSV1 to the fifth global word line GWL5 and the seventh global word line GWL7, and may apply the second unselected word line bias voltage WUSV2 to the eighth global word line GWL8. In an embodiment, the word line control circuit 702 may apply the selected word line bias voltage WSV to the sixth global word line GWL6, may apply the first unselected word line bias voltage WUSV1 to the fifth global word line GWL5 and the seventh global word line GWL7, and may apply the third unselected word line bias voltage WUSV3 to the eighth global word line GWL8.

Therefore, the selected second word line WL6 may be coupled with the sixth global word line GWL6 and be driven with the selected word line bias voltage WSV, and the first and third word lines WL5 and WL7 which are adjacent to the second word line WL6 among unselected word lines may be respectively coupled with the fifth and seventh global word lines GWL5 and GWL7 and be driven with the first unselected word line bias voltage WUSV1. The first to fourth word lines WL1, WL2, WL3, and WL4 of the first word line group WG1 and the first to fourth word lines WL9, WL10, WL11, and WL12 of the third word line group WG3 which are not adjacent to the second word line WL6 may be driven with the second unselected word line bias voltage WUSV2, and the fourth word line WL8 of the second word line group WG2 may be coupled with the eighth global word line GWL8 and be driven with one of the first to third unselected word line bias voltages WUSV1, WUSV2, and WUSV3. The first and third word lines WL5 and WL7 which are adjacent to the selected second word line WL6 may be driven with the first unselected word line bias voltage WUSV1 which has a level lower than the second unselected word line bias voltage WUSV2, and may prevent or mitigate the occurrence of a disturbance of memory cells which are coupled with the first and third word lines WL5 and WL7. The word line control circuit 702 may perform an operation similar to that described above when the first to third word lines WL1, WL2, and WL3 of the first word line group WG1, the third word line WL7 of the second word line group WG2, and the second to fourth word lines WL10, WL11, and WL12 of the third word line group WG3 are selected.

When the first word line WL5 of the second word line group WG2 is selected based on the word line select signal WLS, the word line control circuit 702 may enable together the first and second group select signals GX1 and GX2 and disable the third group select signal GX3. The unselected voltage supply circuit 423 may apply the second unselected word line bias voltage WUSV2 to the first to fourth word lines WL9, WL10, WL11, and WL12 of the third word line group WG3 based on the disabled third group select signal GX3. The word line control circuit 702 may apply the selected word line bias voltage WSV to the fifth global word line GWL5 which is coupled with the first word line WL5 of the second word line group WG2. The word line control circuit 702 may apply the first unselected word line bias voltage WUSV1 to the fourth global word line GWL4 which is coupled with the fourth word line WL4 of the first word line group WG1 adjacent to the first word line WL5 and the sixth global word line GWL6 which is coupled with the second word line WL6 of the second word line group WG2 adjacent to the first word line WL5. The word line control circuit 702 may apply one of the first to third unselected word line bias voltages WUSV1, WUSV2, and WUSV3 to the first to third global word lines GWL1, GWL2, and GWL3 which are coupled with the first to third word lines WL1, WL2, and WL3 of the first word line group WG1 not adjacent to the first word line WL5 and the seventh and eighth global word lines GWL7 and GWL8 which are coupled with the third and fourth word lines WL7 and WL8 of the second word line group WG2 not adjacent to the first word line WL5. While a voltage to be applied to the first to third global word lines GWL1, GWL2, and GWL3 and the seventh and eighth global word lines GWL7 and GWL8 may be any one of the first to third unselected word line bias voltages WUSV1, WUSV2 and WUSV3, an unselected word line bias voltage which has a relatively high level as the position of an unselected word line is close to a selected word line may be applied to the global word line which is coupled with the unselected word line. For example, the word line control circuit 702 may apply the first unselected word line bias voltage WUSV1 to the fourth and sixth global word lines GWL4 and GWL6, may apply the third unselected word line bias voltage WUSV3 to the third and seventh global word lines GWL3 and GWL7, and may apply the second unselected word line bias voltage WUSV2 to the first, second, and eighth global word lines GWL1, GWL2, and GWL8. The word line control circuit 702 may perform an operation similar to that described above when the fourth word line WL4 of the first word line group WG1, the fourth word line WL8 of the second word line group WG2, and the first word line WL9 of the third word line group WG3 are selected.

Figure 10:
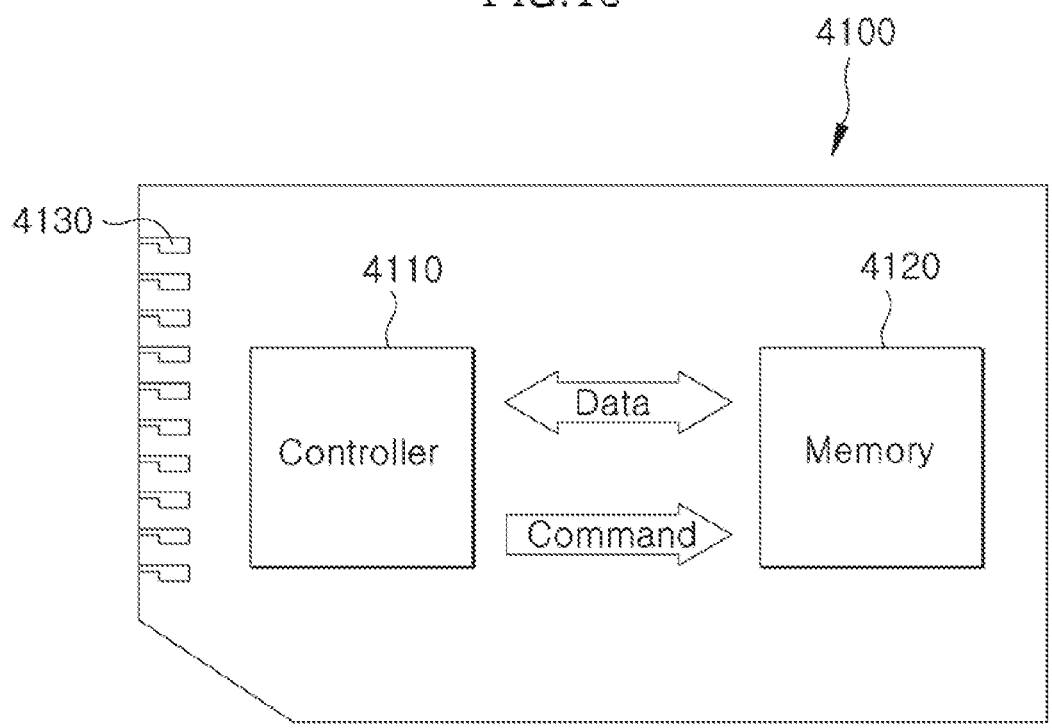
FIG. 10 shows a diagram illustrating a memory card including the semiconductor memory apparatus in accordance with an embodiment.

FIG. 10 shows a diagram illustrating a memory card including the semiconductor memory apparatus in accordance with some embodiments. Referring to FIG. 10, the memory card system 4100 may include a controller 4110, a memory 4120, and interface members 4130. The controller 4110 and the memory 4120 may be configured to exchange a command and/or data. For example, the memory 4120 may be used in storing a command to be executed by the controller 4110 and/or user data.

The memory card system 4100 may store data in the memory 4120 or output data from the memory 4120 to an exterior. The memory 4120 may include the semiconductor memory apparatus according to the above-described embodiments.

The interface members 4130 may control the input/output of data from/to the exterior. The memory card system 4100 may be a multimedia card (MMC), a secure digital card (SD), or a portable data storage device.

Figure 11:
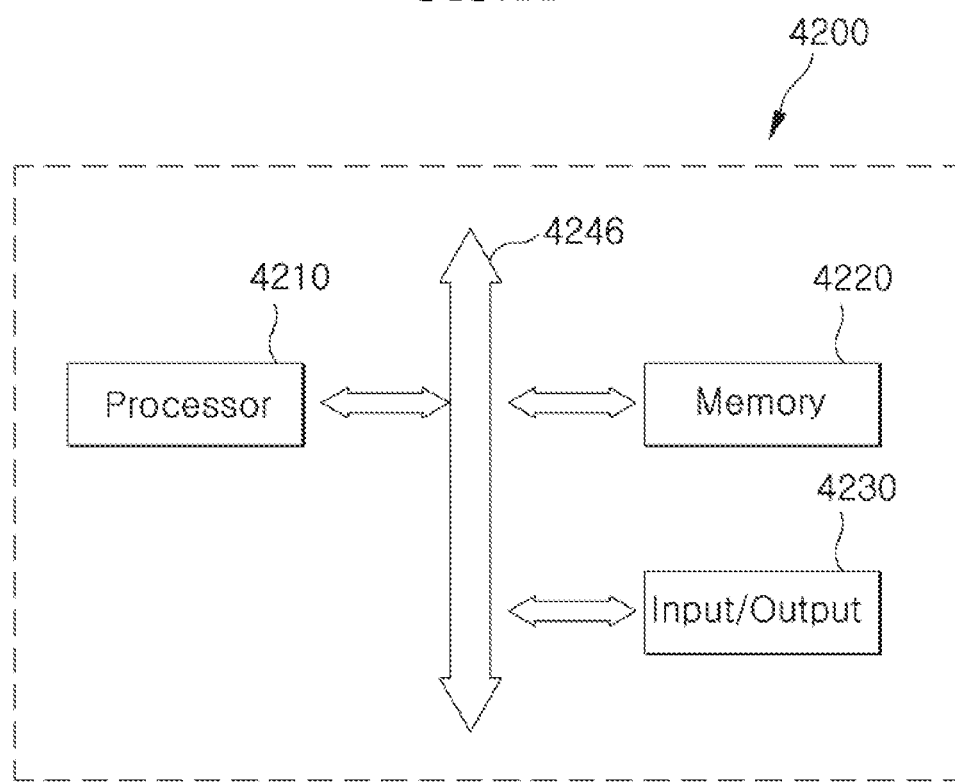
FIG. 11 shows a block diagram to assist in the explanation of an electronic apparatus including a semiconductor memory apparatus in accordance with an embodiment.

FIG. 11 shows a block diagram to assist in the explanation of an electronic apparatus including the semiconductor memory apparatus in accordance with some embodiments. Referring to FIG. 11, the electronic apparatus 4200 may include a processor 4210, a memory 4220, and an input/output device 4230. The processor 4210, the memory 4220, and the input/output device 4230 may be coupled through a bus 4246.

The memory 4220 may receive a control signal from the processor 4210. The memory 4220 may store a code and data for the operation of the processor 4210. The memory 4220 may be used to store data to be accessed through the bus 4246. The memory 4220 may include the semiconductor memory apparatus according to the above-described embodiments. In order for detailed realization and modification, additional circuits and control signals may be provided.

The electronic apparatus 4200 may configure various electronic control apparatuses which use the memory 4220. For example, the electronic apparatus 4200 may be used in a computer system, a wireless communication device, for example, a PDA, a laptop computer, a notebook computer, a web tablet, a wireless phone, a portable phone, a digital music player, an MP3 player, a navigator, a solid state disk (SSD), a household appliance, or all devices capable of transmitting and receiving information under wireless circumstances.

Descriptions appear below for the detailed realization and modified examples of the electronic apparatus 4200, with reference to FIGS. 12 and 13.

Figure 12:
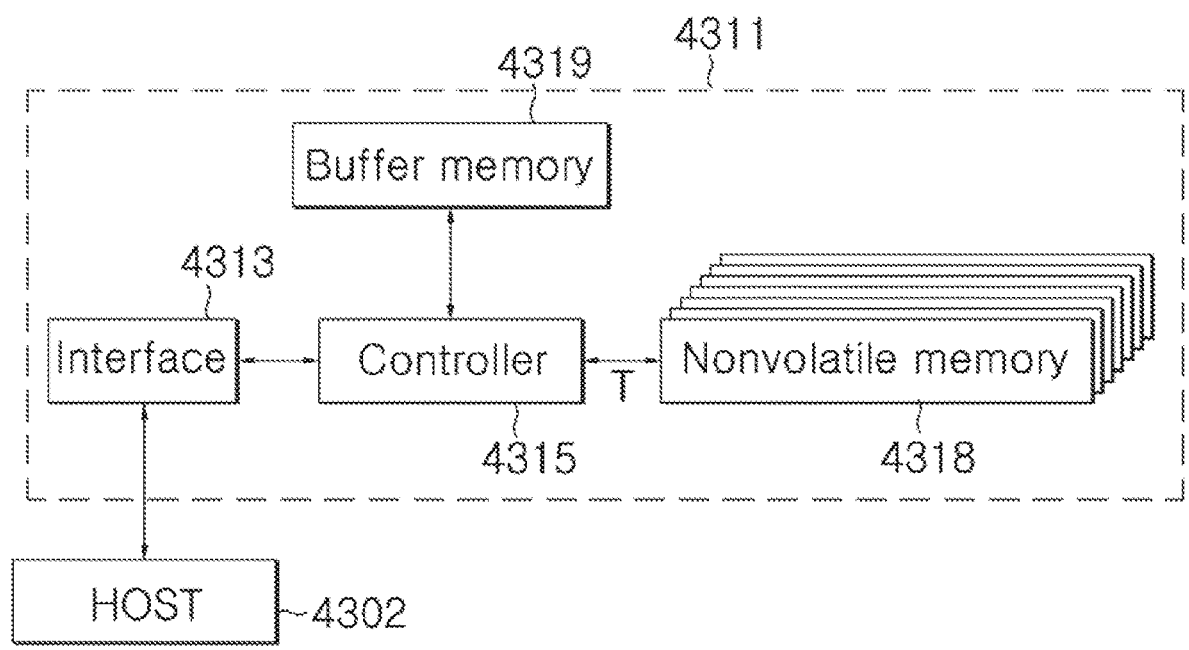
FIG. 12 shows a block diagram illustrating a data storage device including a semiconductor memory apparatus in accordance with an embodiment.

FIG. 12 shows a block diagram illustrating a data storage device including the semiconductor memory apparatus in accordance with some embodiments. Referring to FIG. 12, a data storage device such as a solid state disk (SSD) 4311 may be provided. The solid state disk (SSD) 4311 may include an interface 4313, a controller 4315, nonvolatile memories 4318, and a buffer memory 4319.

The solid state disk 4311 is a device which stores information by using a semiconductor device. The solid state disk 4311 provides advantages in that speed is high, additionally, a mechanical delay, a failure rate, heat generation, and noise generation decrease, and miniaturization, and light weight may be accomplished, when compared to a hard disk drive (HDD). The solid state disk 4311 may be widely used in a notebook PC, a net book, a desktop PC, an MP3 player, or a portable storage device.

The controller 4315 may be formed adjacent to the interface 4313, and be electrically coupled to the interface 4313. The controller 4315 may be a microprocessor including a memory controller and a buffer controller. The nonvolatile memories 4318 may be formed adjacent to the controller 4315, and be electrically coupled to the controller 4315 via connection terminals T. The data storage capacity of the solid state disk 4311 may correspond to the nonvolatile memories 4318. The buffer memory 4319 may be formed adjacent to the controller 4315, and be electrically coupled to the controller 4315.

The interface 4313 may be coupled to a host 4302, and play the role of transmitting and receiving electrical signals such as data. For example, the interface 4313 may be a device which uses the same protocol as SATA, IDE, SCSI, and/or combination thereof. The nonvolatile memories 4318 may be coupled to the interface 4313 via the controller 4315.

The nonvolatile memories 4318 may play the role of storing the data received through the interface 4313. Each of the nonvolatile memories 4318 may include the semiconductor memory apparatus according to above-described embodiments. The nonvolatile memories 4318 have a characteristic that the data stored therein are retained even though power supply to the solid state disk 4311 is cut off.

The buffer memory 4319 may include a volatile memory or a nonvolatile memory. The volatile memory may be a DRAM and/or an SRAM. The nonvolatile memory may include the semiconductor memory apparatus 1 according to above-described embodiments.

The data processing speed of the interface 4313 may be relatively faster when compared to the operation speed of the nonvolatile memories 4318. The buffer memory 4319 may play the role of temporarily storing data. The data received through the interface 4313 may be temporarily stored in the buffer memory 4319 via the controller 4315, and then, be permanently stored in the nonvolatile memories 4318 in conformity with the data recording speed of the nonvolatile memories 4318.

The data frequently used among the data stored in the nonvolatile memories 4318 may be read in advance and be temporarily stored in the buffer memory 4319. Namely, the buffer memory 4319 may play the role of increasing the effective operation speed and decreasing an error occurrence rate of the solid state disk 4311.

Figure 13:
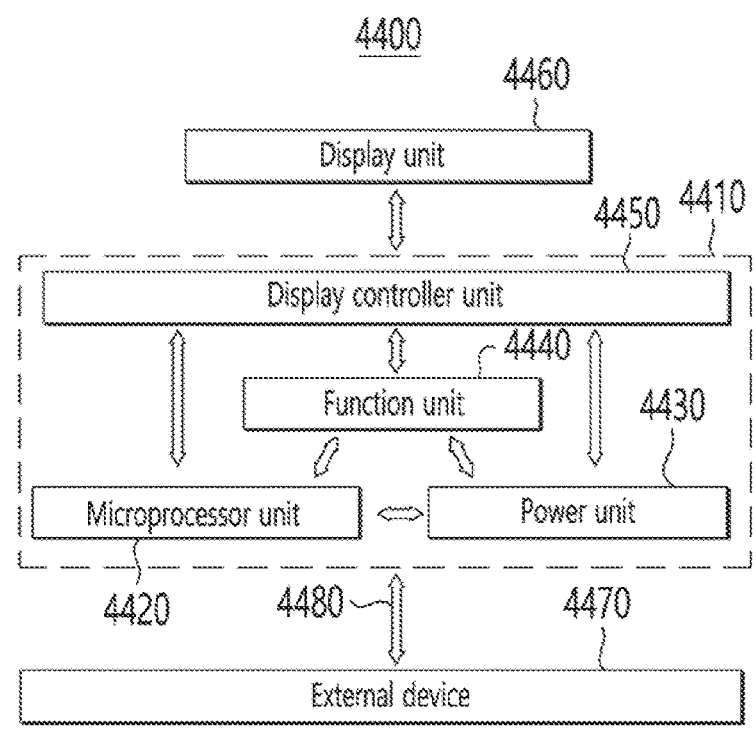
FIG. 13 shows a block diagram illustrating an electronic system including a semiconductor memory apparatus in accordance with an embodiment.

FIG. 13 shows a block diagram illustrating an electronic system including the semiconductor memory apparatus in accordance with some embodiments. Referring to FIG. 13, the electronic system 4400 may include a body 4410, a microprocessor unit 4420, a power unit 4430, a function unit 4440, and a display controller unit 4450.

The body 4410 may be a motherboard which is formed by a printed circuit board (PCB). The microprocessor unit 4420, the power unit 4430, the function unit 4440, and the display controller unit 4450 may be mounted to the body 4410. A display unit 4460 may be disposed inside the body 4410 or outside the body 4410. For example, the display unit 4460 may be disposed on the surface of the body 4410, and display the image processed by the display controller unit 4450.

The power unit 4430 may play the role of receiving a voltage from an external battery or the like, divide the voltage into desired voltage levels, and supply divided voltages to the microprocessor unit 4420, the function unit 4440, the display controller unit 4450, and so forth. The microprocessor unit 4420 may receive a voltage from the power unit 4430, and control the function unit 4440 and the display unit 4460. The function unit 4440 may perform the various functions of the electronic system 4400. For example, in the case where the electronic system 4400 is a portable phone, the function unit 4440 may include various component elements capable of performing the functions of a portable phone such as dialing, image outputting to the display unit 4460 through communication with an external device 4470, voice outputting to a speaker, and so forth. In the case where a camera is mounted together, the function unit 4440 may also play the role of a camera image processor.

In the case where the electronic system 4400 is coupled with a memory card or the like to extend capacity, the function unit 4440 may be a memory card controller. The function unit 4440 may exchange signals with the external device 4470 through a wired or wireless communication unit 4480. In the case where the electronic system 4400 needs a USB or the like to expand functionality, the function unit 4440 may play the role of an interface controller. The semiconductor memory apparatus in accordance with the above-described embodiments may be applied as at least any one of the microprocessor unit 4420 and the function unit 4440.

While various embodiments have been described above, it will be understood to those skilled in the art that the described embodiments represent only a limited number of possible embodiments. Accordingly, the semiconductor memory apparatus for preventing or mitigating disturbance described herein should not be limited based on the described embodiments.

What is claimed is:

1. A semiconductor memory apparatus comprising:
an access line control circuit configured to apply a selected bias voltage to a selected access line coupled with a target memory cell and configured to apply a first unselected bias voltage to an unselected access line adjacent to the selected access line,
wherein a second unselected bias voltage is applied to an unselected access line not adjacent to the selected access line.

2. The semiconductor memory apparatus according to claim 1,
wherein the selected access line comprises a selected bit line,
wherein the unselected access line adjacent to the selected access line comprises an unselected bit line adjacent to the selected bit line,
wherein the unselected access line not adjacent to the selected access line comprises an unselected bit line not adjacent to the selected bit line,
wherein the first unselected bias voltage is lower than the second unselected bias voltage, and
wherein the second unselected bias voltage is lower than the selected bias voltage.

3. The semiconductor memory apparatus according to claim 1,
wherein the selected access line comprises a selected word line,
wherein the unselected access line adjacent to the selected access line comprises an unselected word line adjacent to the selected word line,
wherein the unselected access line not adjacent to the selected access line comprises an unselected word line not adjacent to the selected word line,
wherein the first unselected bias voltage is higher than the second unselected bias voltage, and
wherein the second unselected bias voltage is higher than the selected bias voltage.

4. The semiconductor memory apparatus according to claim 1, wherein the selected bias voltage corresponds to at least one of a write voltage and a read voltage.

5. A semiconductor memory apparatus comprising:
a bit line control circuit configured to apply a selected bit line bias voltage to a selected bit line coupled with a target memory cell and configured to apply a first unselected bit line bias voltage to an unselected bit line adjacent to the selected bit line; and
a word line control circuit configured to apply a selected word line bias voltage to a selected word line coupled with the target memory cell and configured to apply a first unselected word line bias voltage to an unselected word line adjacent to the selected word line,
wherein a second unselected bit line bias voltage is applied to an unselected bit line not adjacent to the selected bit line, and
wherein a second unselected word line bias voltage is applied to an unselected word line not adjacent to the selected word line.

6. The semiconductor memory apparatus according to claim 5, wherein the first unselected bit line bias voltage is lower than the second unselected bit line bias voltage, and wherein the second unselected bit line bias voltage is lower than the selected bit line bias voltage.

7. The semiconductor memory apparatus according to claim 5, wherein the first unselected word line bias voltage is higher than the second unselected word line bias voltage, and wherein the second unselected word line bias voltage is higher than the selected word line bias voltage.

8. The semiconductor memory apparatus according to claim 5, wherein a difference of the selected bit line bias voltage and the selected word line bias voltage corresponds to at least one of a write voltage and a read voltage.

9. A semiconductor memory apparatus comprising:
a bit line control circuit configured to apply a selected bit line bias voltage to a selected bit line coupled with a target memory cell and configured to apply a bit line voltage, having a voltage level between a first unselected bit line bias voltage and a second unselected bit line bias voltage, which is higher in proportion to a distance from the selected bit line to an unselected bit line to which the bit line voltage is applied; and
a word line control circuit configured to apply a selected word line bias voltage to a selected word line coupled with the target memory cell and configured to apply a word line voltage, having a voltage level between a first unselected word line bias voltage and a second unselected word line bias voltage, which is lower in proportion to a distance from the selected word line to an unselected word line to which the word line voltage is applied.

10. The semiconductor memory apparatus according to claim 9, wherein the first unselected bit line bias voltage is lower than the second unselected bit line bias voltage, and wherein the second unselected bit line bias voltage is lower than the selected bit line bias voltage.

11. The semiconductor memory apparatus according to claim 9, wherein the first unselected word line bias voltage is higher than the second unselected word line bias voltage, and wherein the second unselected word line bias voltage is higher than the selected word line bias voltage.

12. The semiconductor memory apparatus according to claim 9, wherein a difference of the selected bit line bias voltage and the selected word line bias voltage corresponds to at least one of a write voltage and a read voltage.

* * * * *